United States Patent [19]
Psaltis et al.

[11] Patent Number: 6,072,608
[45] Date of Patent: Jun. 6, 2000

[54] COMPACT ARCHITECTURE FOR HOLOGRAPHIC SYSTEMS

[75] Inventors: Demetri Psaltis; Jean-Jacques P. Drolet; George Barbastathis, all of Pasadena, Calif.

[73] Assignee: California Institute of Technology, Pasadena, Calif.

[21] Appl. No.: 09/304,809

[22] Filed: May 3, 1999

Related U.S. Application Data

[62] Division of application No. 08/712,170, Sep. 11, 1996, Pat. No. 5,959,747.

[51] Int. Cl.[7] ........................................ G03H 1/26
[52] U.S. Cl. .................... 359/22; 359/11; 359/21; 359/35; 365/125; 365/216
[58] Field of Search .................... 359/3, 10, 11, 359/21, 22, 24, 25, 27, 35; 365/125, 216

[56] References Cited

U.S. PATENT DOCUMENTS

| | | | |
|---|---|---|---|
| 4,449,785 | 5/1984 | Huignard et al. | 359/24 |
| 5,471,515 | 11/1995 | Fossum et al. | 377/60 |
| 5,513,022 | 4/1996 | Son et al. | 359/10 |
| 5,557,431 | 9/1996 | Pepper | 359/10 |
| 5,568,574 | 10/1996 | Tanguay, Jr. et al. | 359/15 |
| 5,684,611 | 11/1997 | Rakuljic et al. | 359/10 |
| 5,719,691 | 2/1998 | Curtis et al. | 359/11 |

OTHER PUBLICATIONS

Drolet, et al., *Integrated optoelectronic interconnects using liquid–crystal–on–silicon VLSI.*, SPIE Proceedings CR62: Optoelectronic Interconnects and Packaging, pp. 106–1311996., Drolet, et al., *Liquid crystal devices for volume holographic memories.*, OSA Annual Meeting, Sep. 1996.

Feinberg, et al., *Self–pumped, continuous–wave phase conjugator using internal reflection.*, Optics Letters, 7(10):486, Oct. 1982.

Mendis, et al., *CMOS Active Pixel Image Sensor.*, IEEE Transactions on Electron Devices, 41(3):452, Mar. 1994.

Mendis, et al., *Design of a Low–Light–Level Image Sensor with On–Chip Sigma–Delta Analog–to–Digital Conversion*, Proceedings of the SPIE, 1900:31, 1993.

Zhao and Sayano, *Compact read–only memory with lensless phase–conjugate holograms.*, Optics Letters, 21(16):1295, Aug. 15, 1996.

*Primary Examiner*—Darren E. Schuberg
*Attorney, Agent, or Firm*—Fish & Richardson P.C.

[57] ABSTRACT

An architecture for holographic data storage and processing integrates multifunctional silicon-based optoelectronic devices, rewritable holographic material, optical devices and other electro-optical elements in compact and high-performance systems. A dynamic hologram refresher based on optoelectronic integrated circuits has a smart pixel structure including an electrically addressed SLM to write a new data page, a thresholding detector array for readout, and a memory to latch the data from the detector to the modulator in each pixel. In particular, conjugate reconstruction is used in combination with the dynamic hologram refresher to retrieve data from volume multiplexed holograms in the rewritable holographic material.

8 Claims, 20 Drawing Sheets

COMPACT ARCHITECTURE FOR HOLOGRAPHIC SYSTEMS

This is a divisional of U.S. application Ser. No. 08/712,170, filed Sep. 11, 1996, now U.S. Pat. No. 5,959,747.

FIELD OF THE INVENTION

The present invention relates to the field of optoelectronic devices and systems for optical data storage and information processing. More particularly, the present disclosure describes a compact architecture for integrated multiplexed holographic memory units and processors.

BACKGROUND AND SUMMARY OF THE INVENTION

Optical holographic devices and systems present an emerging technology for information storage and processing devices and systems. Optical holographic devices and systems have interesting properties such as high speed in data transfer and processing, the capability of massive parallel processing, and superior resistance to electromagnetic interference. One unique property of holographic memory devices is their high capacity data storage, fast access time and transfer rate. This is particularly useful in applications that demand such high capacity. Other examples of optical holographic systems include holographic correlators for image recognition, holographic associative memories, holographic neuromorphic systems, and holographic interconnection systems.

Certain drawbacks, however, have limited the use of many optical holographic devices and systems. For example, imaging optics is often used in many prior-art systems. This places limit on miniaturization of these systems. The optical alignment of an imaging assembly is often stringent and sensitive to factors such as vibration and temperatures. The limitations in the prior-art optical systems become significant and often present obstacles to the full use of the unique advantages that are inherent in optical holographic systems.

Two conventional systems are examined in the following to further illustrate the advantages of optical holographic systems as well as the limitations of conventional optical implementations.

FIG. 1 is a schematic of a conventional holographic system 100 for three dimensional data storage. Information is stored in the holographic medium 102 in the form of multiple superimposed holograms. Each hologram is recorded by the interference of a signal beam 110 coming from the signal arm 104 with a reference beam 120 from the signal arm 104. A transmissive spatial light modulator (SLM) 112 in the reference arm 106 imprints data on the signal beam 110. Imaging optics 114, e.g., a Fourier-transforming lens, relays the data from the SLM 112 to the holographic medium 102. The reference arm 106 has a motor-driven rotating mirror 122 and a 4f imaging system having lenses 124 and 126. The reference beam 120, often a plane-wave, is directed to the holographic medium 102 at a specific angle. The coherent interference between the data-bearing signal beam 110 and the reference beam 120 in the holographic medium 102 records one page of data corresponding to that specific angle. Multiple data pages are recorded and superimposed by changing the angle of the reference beam 120 relative to the motor-driven rotating mirror 122.

To access a specific data page within the memory during readout, the reference beam 120 is directed to the holographic medium 102 at the angle at which that data page is recorded. A reconstruction beam 130 was generated by the diffraction of the reference beam 120 from the hologram stored in the medium 102. Imaging optics 132 (e.g., a Fourier-transforming lens) and a detector array 134 (e.g., a CCD camera) are used to retrieve the data in the reconstruction beam 130. The motor-driven mirror 122 directs the reference beam 120 to address individual data pages within the memory.

The above described system 100 is a holographic memory based on angularly multiplexed volume holograms. Such a structure is well known in the art. Each data page represents a two dimensional data array. Many data pages can be holographically multiplexed into the same recording volume. The holographic medium 102 can be made very compact in size. A storage density of 100 GB per $cm^3$ is possible. Other holographic multiplexing techniques can be used to superimpose multiple data pages in a common recording volume including phase-code multiplexing, fractal multiplexing and peristrophic multiplexing, shift multiplexing, and wavelength multiplexing. The storage capacity of a volume multiplexed holographic memory of volume V is of the order of $V/\lambda^3$ where $\lambda$ is the light wavelength. This number can be as large as $10^{12}$ for moderate crystal sizes (e.g. 1 cm), but usually factors such as dynamic range and optics apertures reduce it by several orders of magnitude to an estimate of several GB per $cm^3$. As an example, 160,000 holograms were recently demonstrated in 1 cm of Fe-doped $LiNbO_3$ by using angle and fractal multiplexing in the 90° geometry, and 1,000 holograms were recorded in 100 $\mu m$ thick photopolymer by using angle and peristrophic multiplexing in the holographic disk geometry.

The data readout in such holographic memory systems is fast. A page is often read out in the form of a two dimensional array by the reference read beam 120 simultaneously in parallel at the speed of light. Each data page can be randomly accessed by simply directing the readout reference beam 120 at a proper angle.

However, lenses are required to image the reconstructed data page on the detector array 134 in the conventional system 100 in FIG. 1. The required separation between the lenses, the SLM and the detector array imposes a minimum size on the system. The detector array 134 must be aligned to within a fraction of the pixel size with respect to the SLM 112 in order to properly register the multiplexed data pages in the readout. The motorized mirror 122, however, usually has significant inertia. This provides a high power dissipation and low response speed. The motorized mirror 122 also may have backlash which prevents Bragg matching the stored holograms correctly. The mechanical motion of the system thus significantly hinders the full potential of high speed of the holographic memory. In addition, such a system is difficult to integrate with other electronic data processing units.

The second example of conventional optical holographic system is an optical neural network. Artificial neural networks are usually arranged in layers. Neurons at each layer do not interact with neurons at the same layer, but are densely interconnected to neurons at other layers. In a typical implementation, shown in FIG. 2a, the neural network has two layers. The input layer 202 receives information (e.g. sensory data of spatial or temporal nature) in the form of a real vector $(f_1, \ldots, f_n)$. The middle layer 204 performs a nonlinear operation $g^{(1)}$ to weighted sums of input components, producing the internal representation $(h_1, \ldots, h_m)$, where $$h_i = g^{(1)}\left(\sum_j w_{ij}^{(1)} f_j\right). \quad (1)$$

The role of the middle layer 204 is to apply a nonlinear transformation to its input that will make the internal representation of input classes linearly separable. The output layer 206 (very often a single neuron) combines outputs of the hidden layers and applies a nonlinearity $g^{(2)}$ to the result before producing the classification (or decision) vector $y_i$, i.e.

$$y_i = g^{(2)}\left(\sum_j w_{ij}^{(2)} h_j\right). \quad (2)$$

Networks with more than two layers can be constructed, but the two-layer architecture is most common, because it is sufficient for any segmentation of the input space with relatively cost-efficient training.

Holographic optical systems offer an elegant solution for the implementation of the interconnections in neural networks. In contrast to electrical signals, optical beams are not affected by capacitive coupling, therefore large numbers of interconnects may coexist in a small volume. They all operate at the speed of light or at some fraction thereof. The mathematical model for the neural network usually determines the optical implementation.

One optical implementation of the system of FIG. 2a is shown in FIG. 2b. Volume holograms stored in an appropriate recording medium define the interconnects. The strengths can be either precomputed and stored directly, or trained in real-time. Popular materials for this kind of architecture include photorefractives; in the case of disk-based implementations, other media such as photothermoplastic, optical memory disks, and photopolymers have been investigated. Since each hologram can carry $10^5$–$10^6$ bits (each bit corresponds to a single plane wave hologram component in the Fourier plane geometry), the capacity of these systems, expressed as simple neuron-to-neuron interconnects, can be as high as $10^{11}$.

Various ways of organizing interconnects are possible. FIG. 2b shows an implementation by an optical volume holographic correlator. The Fourier transforms of the training templates are holographically multiplexed and stored in the holographic medium 220. A test template is imprinted on a beam 210 by a SLM 212. The test template is Fourier transformed by a lens 214 and simultaneously correlated with all stored templates by reading out the multiplexed holograms in the holographic medium 220. An output reconstruction beam 222 is generated. The Fourier transforms of the reconstructed references by a lens 224 yield the cross-correlations, which are captured by an array of photodetectors 226 in the output plane.

The degree of similarity with the stored patterns in the holographic medium 220 is thus determined, and an electronic nonlinearity can perform, e.g. a thresholding operation to determine whether the template presented to the correlator belongs to the set of stored templates. This method has been used successfully for pattern recognition such as face and fingerprint recognition. A more complicated output layer algorithm was implemented for target tracking and the indoor navigation of a robot car.

The correlator geometry described above has many advantages in addition to the capability of large number of interconnects. For example, one advantage is the invariance of the correlation to translation in the input pattern, resulting from correlating in the Fourier domain. When three-dimensional materials are used, Bragg selectivity limits the shift invariance in one dimension (in the plane defined by the reference and the signal carrier), but the remaining vertical shift invariance is sufficient to allow successful generalization in many systems. Another advantage is that the stored templates can be directly recalled in the same setup if read-out by the reference beams, typically one at a time.

Many other optical systems can be built based on the system in FIG. 2b. For example, one can construct an associative memory which is a simple model for a neural network capable of recalling one out of several stored patterns when a distorted version of the desired pattern is presented at its input.

However, the system in FIG. 2b, also suffers limitations. For example, since a holographic medium 220 is used to store data-bearing holograms, the conventional imaging optical systems and beam steering elements are used for recording and reconstructing the holograms. This presents serious obstacles to achieving a high performance and compact neural network. In addition, the bulky conventional systems are expensive to manufacture. Despite the distinct advantages and versatile applications, the conventional optical components and architecture are limiting in full utilization of these advantages.

In recognition of the above, the inventors of the present invention developed new system architectures based on volume holographic storage. The present invention will improve the compactness, ease of alignment, cost, weight and suitability to industrial fabrication of random-access volume holographic rewritable memories and other optoelectronic systems. The new system architectures use modules having three dimensional holographic materials, programmable beam steering devices such as diffractive optical elements, and optoelectronic integrated circuits (OEIC) using modulating elements such as liquid crystal modulators for light modulation.

The conventional complex imaging optical elements such as 4f lens assembly are eliminated from the signal arm in the new system architectures in accordance with the present invention. This is accomplished in the preferred embodiments by using integrated component interconnections and conjugate readout. This presents several advantages. For example, the difficulty in achieving and maintaining the desired alignment is significantly reduced. The adverse effects caused by factors such as vibrations are thus minimized. Elimination of imaging optics further reduces the size of the system and facilitates system integration. In particular, phase conjugators are used to implement the conjugate readout. Phase conjugation yields beams that retrace themselves, thereby canceling any aberrations present in the backward path. Thus the need for imaging optics is eliminated.

The preferred embodiments of the present invention use programmable diffractive optical elements to accurately control the directions of optical beams for recording and retrieving data and for information processing operations. According to the present invention, liquid crystal deflectors are integrated with the holographic cubes to replace the motor-driven mirror or acoustic-opto modulators along with imaging optical elements used in many conventional systems for redirecting light beams. This largely eliminates the problems associated with conventional mechanical addressing systems (e.g., vibrations, backlash, low speed, high power consumption) and with acousto-optic deflectors (e.g., wavelength shift, high-voltage operation). This reduces the dimension of the systems, increases the response speed, simplifies the optical alignment, and enhances the system robustness.

One unique aspect of the present invention is a multifunctional OEIC that integrates a modulator array and a detector array together to form a spatial light modulator and a two-dimensional detector array on the some surface of a die. The conjugate readout used in the preferred embodiments is self-retracing. The compact detectors and light modulators can be spatially close to each other or physically superimposed together. One significant advantage of such integration is that the alignment of the detectors and the modulators is automatically guaranteed. The stringent aligning requirement of the detector array relative to the SLM that is required in a conventional holographic system is hence significantly relaxed. Also, the cost of commercial fabrication of holographic systems is greatly reduced since well-developed semiconductor fabrication processes can be used in making the OEICs with high yield.

In operation, the OEIC of the present invention can be programmed to perform spatial light modulation for recording two dimensional data pages or to detect light signals for retrieving data. Furthermore, it can also periodically refresh the dynamic holograms that slowly decay as a result of accesses to the read/write memory. Thus, the OEIC of the present invention is also a Dynamic Holographic Refresher (DHR).

Volume multiplexed holograms are implemented in the integrated architectures in accordance with the present invention. Angularly multiplexed module, wavelength multiplexed module, phase-coded module, and shift-multiplexed module are the preferred embodiments of the present invention.

The new integrated system architectures have versatile applications in a number of optical holographic systems including, but not limited to, high-density holographic memory, holographic correlators for image recognition, holographic associative memories, and holographic interconnects.

These and other advantages of the present invention will become more apparent in the light of the following detailed description of preferred embodiments thereof, as illustrated in the accompanying drawings.

DESCRIPTION OF THE PREFERRED EMBODIMENTS

Compact Architecture for Holographic Systems

The compact architecture for holographic systems in accordance with the present invention integrates a number of components in a compact package, including, but not limited to, a piece of rewritable holographic material (e.g., a photorefractive crystal cube), optoelectronic components such as optoelectronic integrated circuits (OEICs), programmable diffractive optical elements (DOEs), spatial light modulators (SLMs), detector arrays, and possibly a beam coupling device such as a beam splitter. The optoelectronic components are attached to faces of the photorefractive crystal or the beam coupling device.

Figure 3A:
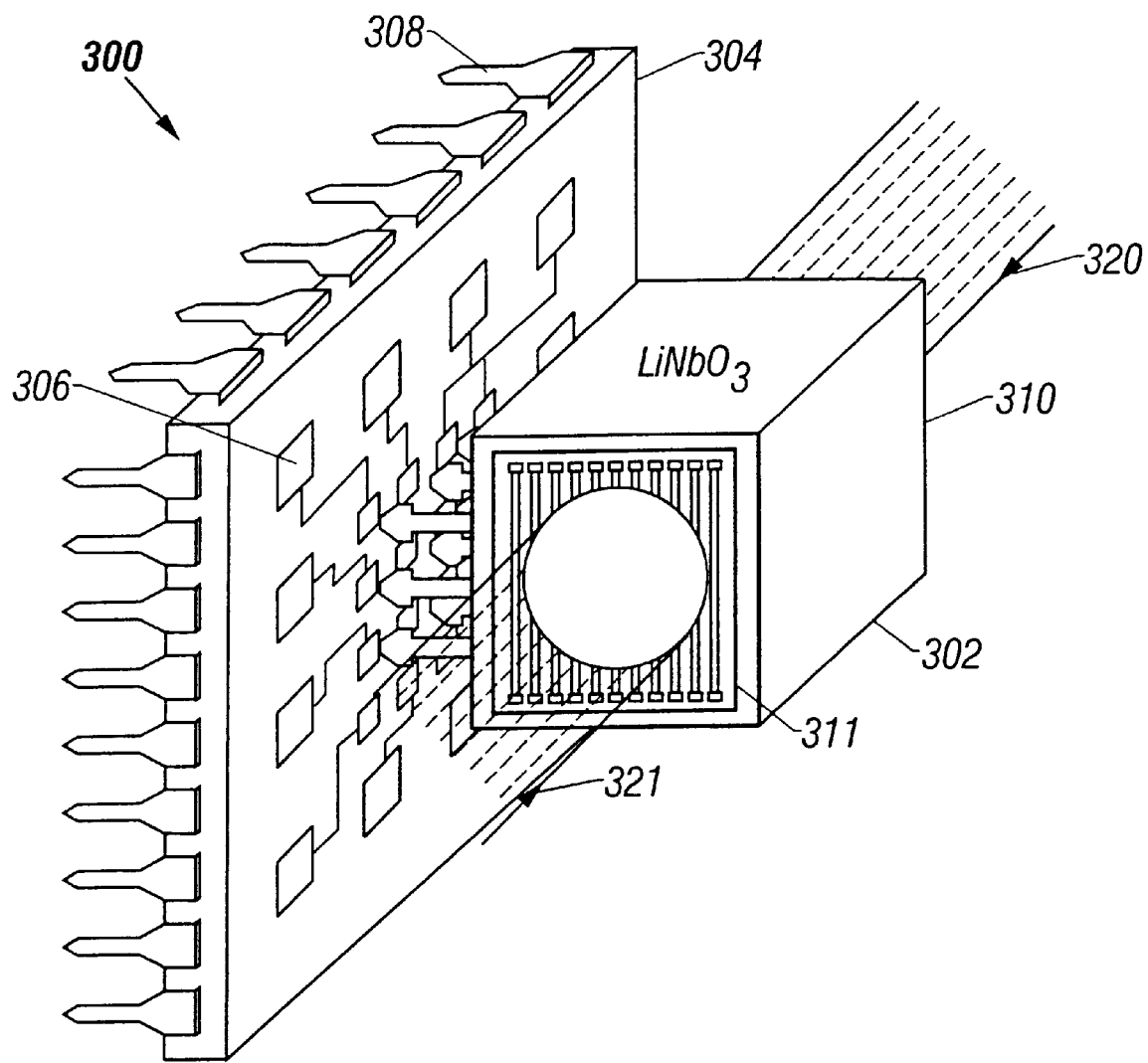
FIG. 3a is a schematic of the compact architecture for an optical angularly multiplexed holographic memory in accordance with the present invention.

FIG. 3a illustrates one preferred embodiment of the compact architecture. This module 300 can implement the new features in accordance with the present invention such as conjugate readout, compact integration, lens-less data path, and combined SLM/detector array. A rewritable holographic recording cube 302 (e.g., lithium niobate) is used to store information in the form of volume multiplexed holograms. An optoelectronic integrated circuit (OEIC) 304 is integrated with the crystal cube 302. The OEIC 304 includes semiconductor substrate with an array of pixels on one surface thereof. Each pixel 306 includes a reflective modulator for recording holograms, a detector for readout, and a memory unit. The reflective modulator and the detector in each pixel are sometimes displaced relative to each other. Multiple electrical connectors 308 are used for data communication, power supply, and integration with other modules.

A pair of beam steerers, e.g., diffractive optical elements or DOES, 310 and 311 (310 is hidden behind the crystal cube 302) is used to angularly multiplex holograms in the crystal cube 302. The DOEs 310 and 311 can be controlled to change the propagation angle of a beam passing therethrough. A signal beam propagating away from the crystal cube 302 and towards the interface of OEIC 304 is reflected and modulated by each pixel 306. A two dimensional data array can be imprinted upon the signal beam to store a data page in the crystal cube 302. Holograms are written in the crystal cube 302 by interfering the modulated signal beam traveling towards the crystal cube 302 with a reference beam 320 coming from the back of the crystal cube 302. Multiple holograms are superimposed and recorded by changing the emerging angle of the reference beam 320 from the DOE 310. Holograms in the crystal cube 302 are read out by illuminating the crystal cube 302 from the front with a counter-propagating reference beam 321. That reference beam 321 is the conjugate of the reference beam 320 employed to write the holograms. The resulting conjugate reconstruction beam propagates back towards the interface of the OEIC 304. The array of pixels on the OEIC 304 converts the optical signal into electrical signals with the detectors for data readout. Different data pages are read out by changing the angle of the conjugate beam with the DOE 311 on the front surface of the crystal cube 302.

Figure 1:
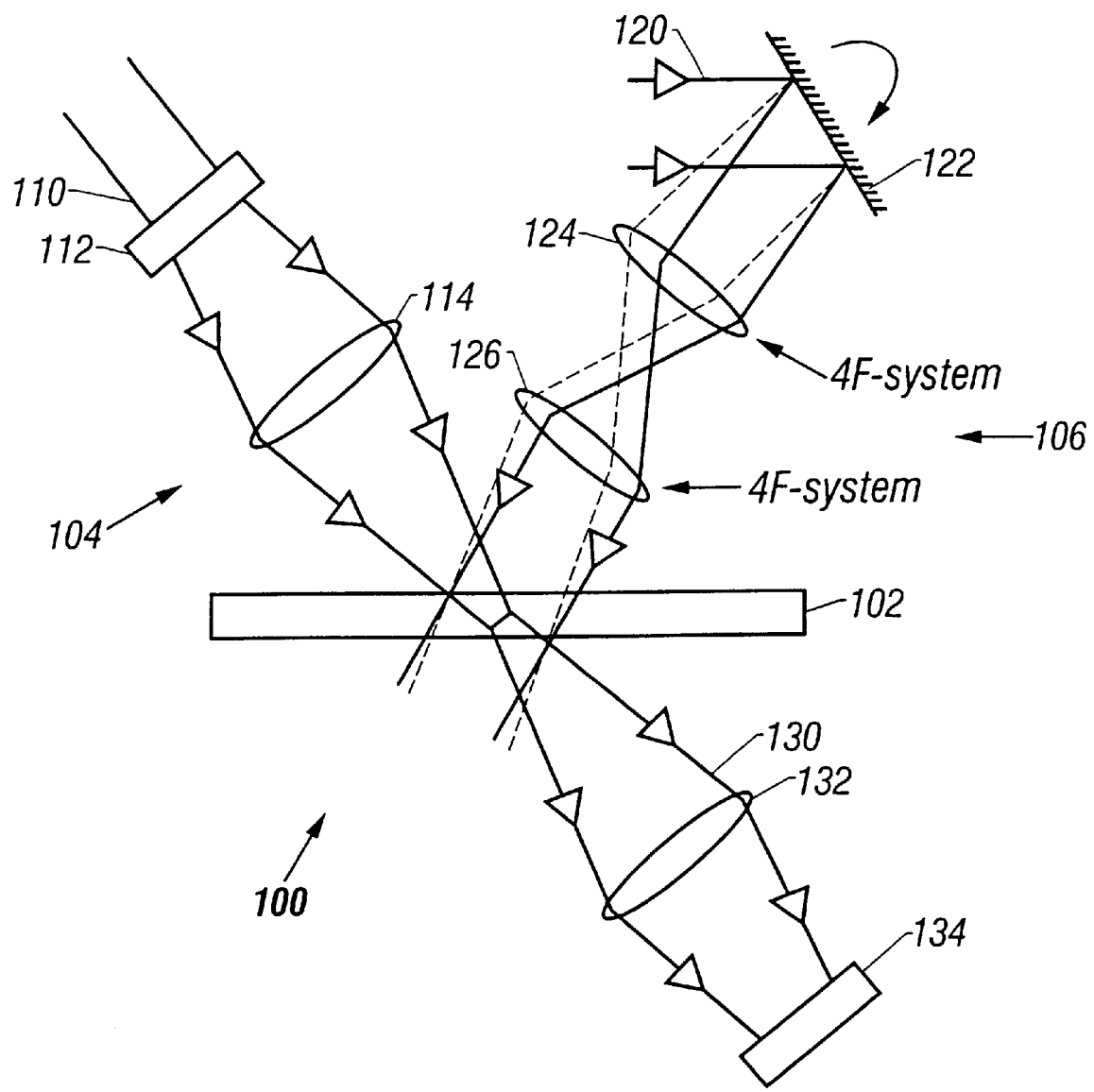
FIG. 1 is a schematic of the conventional optical memory architecture for 3 dimensional holographic data storage based on angular multiplexing.
Figure 2A:
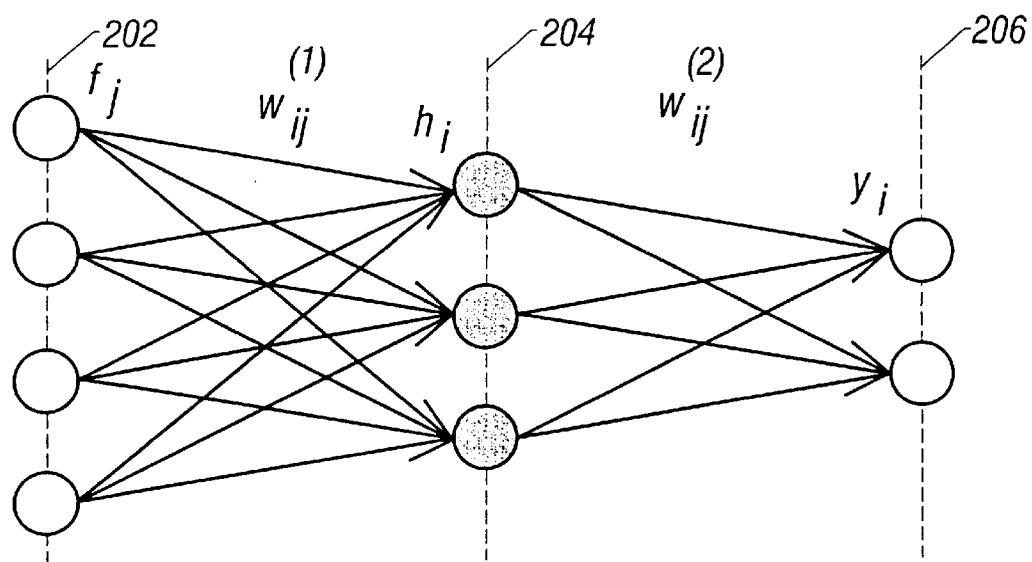
FIG. 2a shows a two-layer neural network.
Figure 2B:
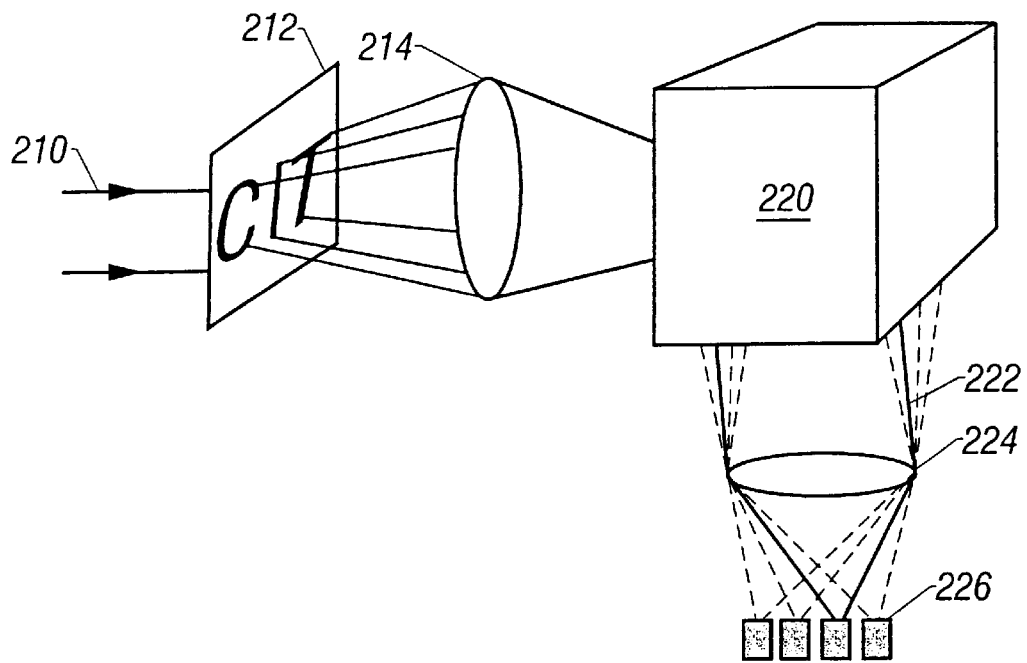
FIG. 2b is a schematic of an optical correlator.

Many advantages of the proposed approach are best appraised when the compact module of FIG. 3a is compared to the conventional holographic memory based on angular multiplexing shown in FIG. 1. The compact module shown in FIG. 3a of the present invention preferably contains neither lenses nor bulky and complex imaging optical systems. Conjugate readout eliminates the need for imaging optics, since the reconstruction retraces the path and phase profile of the signal beam during recording. This allows all the components to be assembled in a single compact structure. If a single OEIC containing modulators and detectors at each pixel location is employed, alignment is guaranteed by design. Furthermore, the page addressing devices, the DOEs 310 and 311, are free of many of the problems associated with conventional mechanical addressing systems such as vibration, backlash, low speed, high power consumption and with acousto-optic deflectors such as wavelength shift, high-voltage operation. Finally, because phase conjugation largely undoes aberrations in the signal path, phase-conjugate reconstructions are high fidelity.

In the above embodiment shown in FIG. 3a, one way to produce the signal beam propagating towards the OEIC 304 is to use a beam coupling device such as a beam splitter (not shown). The beam coupling device is disposed between the OEIC 304 and the crystal cube 302. Another way is to use fixed illumination holograms in the crystal cube 302 as will be discussed hereafter in this disclosure. The conjugate readout reference beam 321 can be generated by using a phase conjugator or a self-retracing mirror loop or simply a mirror. The inventors built two experimental systems based on the embodiment of FIG. 3a.

Figure 3B:
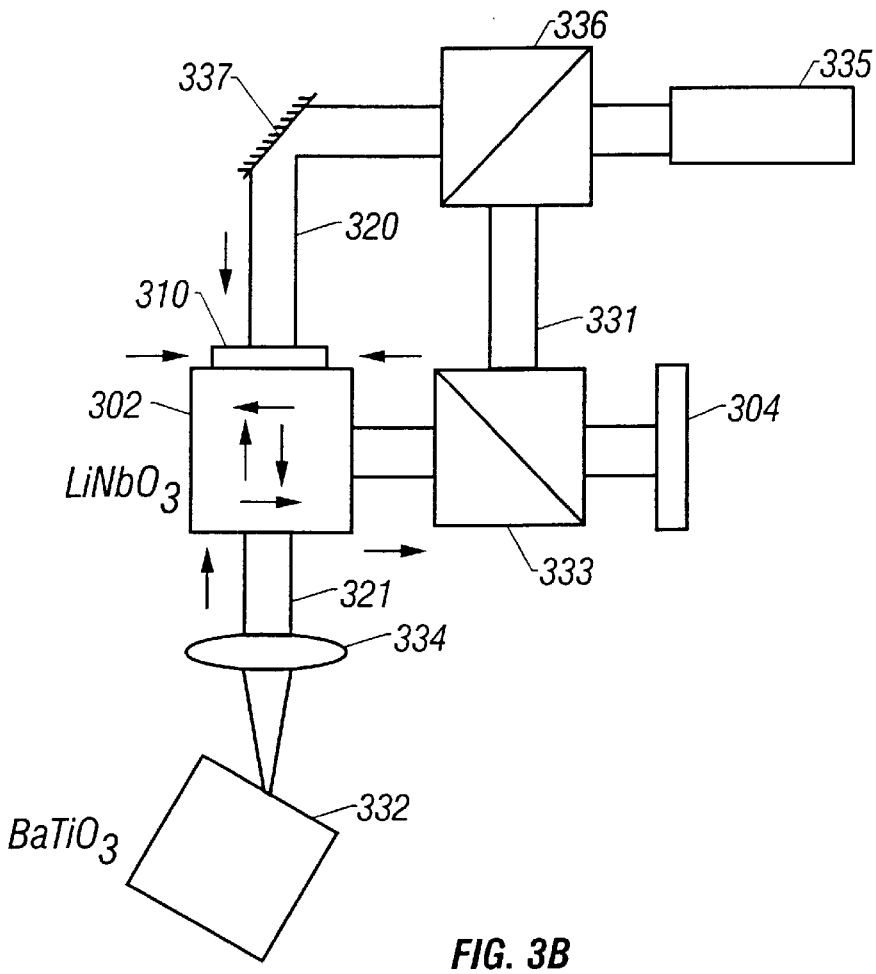
FIG. 3b shows one embodiment of the compact memory architecture based on angular multiplexing using a phase conjugator.

FIG. 3b shows a compact memory architecture 330 using a $LiNbO_3$ photorefractive crystal for the crystal cube 302 and a $BaTiO_3$ self-pumped phase conjugator 332 in a "cat" geometry. Other types of phase conjugators can be used but a self-pumped phase conjugator was used for simplicity. A detailed description of the $BaTiO_3$ self-pumped phase conjugator 332 in "cat" geometry is incorporated in this specification by the following reference: J. Feinberg, "Self pumped continuous wave phase conjugator using internal reflection", Optics Letters, vol. 7, pp.486, 1982. A beam splitter 336 splits the output beam from a laser 335 into the writing reference beam 320 and the signal beam 331. A portion of the signal beam 331 is directed towards the OEIC 304 by a beam splitter 333. The modulators in the pixels of the OEIC 304 imprint a data page onto the signal beam and direct it to the crystal cube 302. A data-bearing hologram is recorded in the crystal cube 302 by the interference of the writing reference beam 320 and the reflected data-bearing signal beam. The DOE 310 is used to change the angle of the reference beam 320 to angularly multiplex multiple holograms in the same recording volume in the crystal cube 302. During readout, only the reference beam 320 is used and the signal beam 331 is blocked. The DOE 310 directs the reference beam 320 at a specific angle corresponding to a desired data-bearing hologram. The reference beam 320 goes through the cube 302 and is focused into the $BaTiO_3$ self-pumped phase conjugator 332 by a focusing lens 334. A read conjugate reference beam 321 that is phase-conjugate to the reference beam 320 is generated by the phase conjugator 332. The reconstruction beam propagates towards the OEIC 304 where the detectors in the pixels read out the data.

Figure 3C:
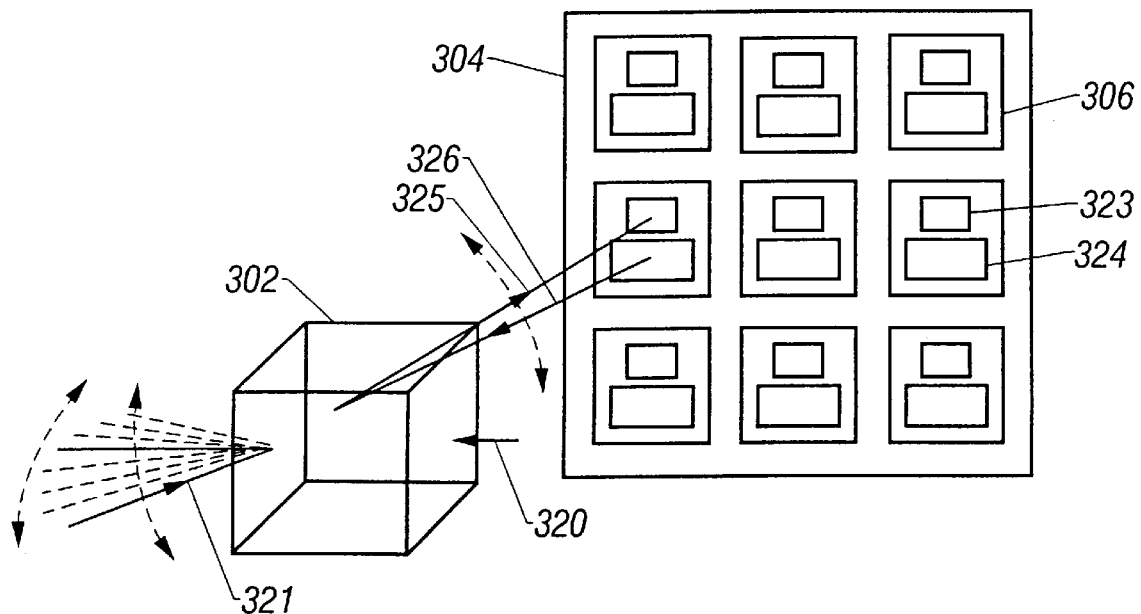
FIG. 3c shows the angle biasing mechanism for the conjugate readout beam of the compact memory architecture.

Implementation of the above described conjugate readout is dependent on the design of the OEIC 304. According to the present invention, the OEIC 304 has two configurations in arranging the modulator and the detector in a pixel. One is to physically overlap the modulator and detector in one element. In another configuration as shown in FIG. 3c, the modulator 324 and the detector 323 in each pixel 306 of the OEIC 304 are spatially displaced relative to each other. The implementation of the conjugate readout in the latter configuration of the OEIC 304 requires an extra step. This is because the reconstruction beam by the phase conjugate read beam 321 would go to the modulator 324 rather than the detector 323 since the phase-conjugated reconstruction exactly re-traces the path of the signal beam 326 reflected from the modulator 324. According to the present invention, an additional beam steering element such as a DOE induces a small angular bias in the conjugate read beam 321 such that the reconstruction beam 325 of the read beam 321 from the phase conjugator 332 is directed to the detector ,23 in each pixel element 306 on the OEIC 304.

FIG. 3c shows the details on how such angle biasing for the readout is implemented for an OEIC having non-colocated modulators and detectors. It is well known in the art that a hologram becomes Bragg mismatched if the plane-wave read reference 321 is rotated inside the plane defined by the optical axes of the writing reference beam 320 and signal beam 326. This would degrade the reconstruction. However, If the read reference beam 321 rotates in a plane that is perpendicular to the above-defined plane, the hologram does not become Bragg-mismatched. Instead the direction of propagation of the reconstruction beam 325 rotates following the rotation of the read reference beam 321. This property is the base of some multiplexing methods such as fractal and peristrophic multiplexing. The inventors use this property to direct the reconstruction beam 325 onto the photodetector 323 in each pixel element 306. In particular, during reconstruction, the read reference beam 321 is tilted by an appropriate angle in the above proper direction. This results in the phase-conjugated reconstruction 325 tilting in the same direction. The orientation of the OEIC 304 with respect to the direction of the writing reference beam 320 is arranged so that the phase-conjugated reconstruction beam 325 falls on the detector 323. This simple technique allows the same device, OEIC 304, to perform both light modulation and detection simultaneously, by using the additional beam steering element, to perform the readout beam deflection while still maintaining the phase-conjugate property of the reconstruction.

In the compact architecture shown in FIG. 3b, a phase conjugator 332 is used. The above technique is implemented with an OEIC having relatively displaced modulator and detector in a pixel by biasing the reference beam 320 at a proper angle in the direction perpendicular to the plane defined by the writing beams 320 and 331 during readout.

Two reconstruction beams are generated in FIG. 3b during readout. The first reconstruction is generated by the reference beam 320, which propagates in the same direction of the original data-bearing signal beam from the OEIC 304. The second reconstruction is generated by the conjugate reference beam 321. Both of the reconstruction beams are thus shifted slightly such that the conjugate reconstruction beam is shifted to the detectors on the OEIC 304 rather than the modulators.

Figure 3D:
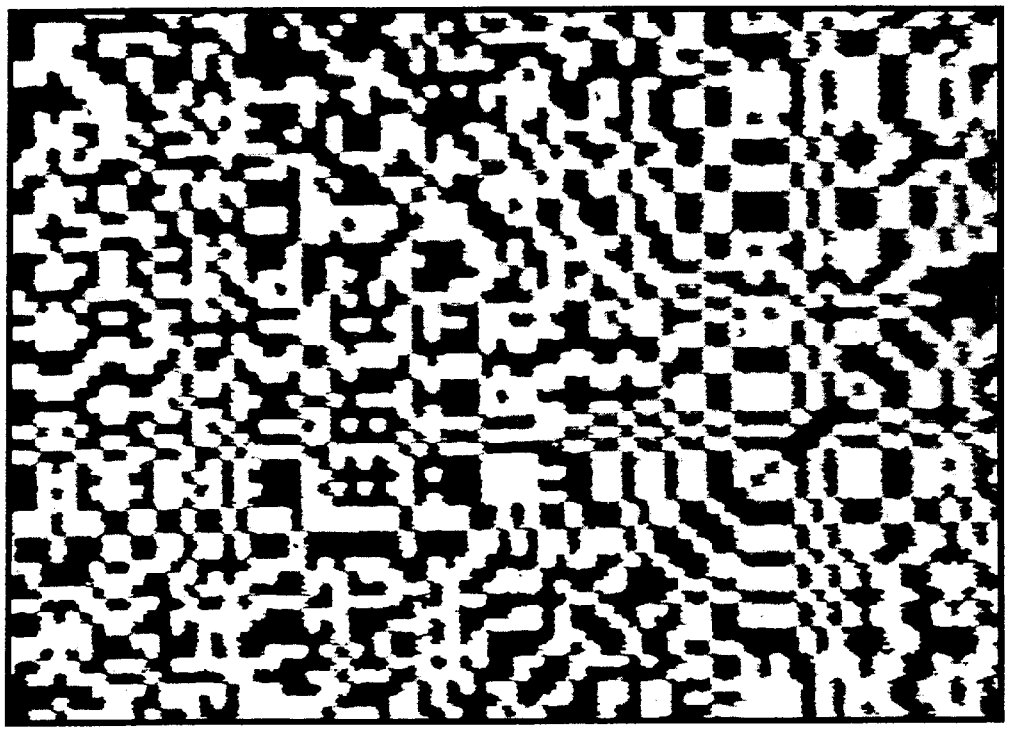
FIGS. 3d–3e show the experimental results of the architecture in FIG. 3b.
Figure 3E:
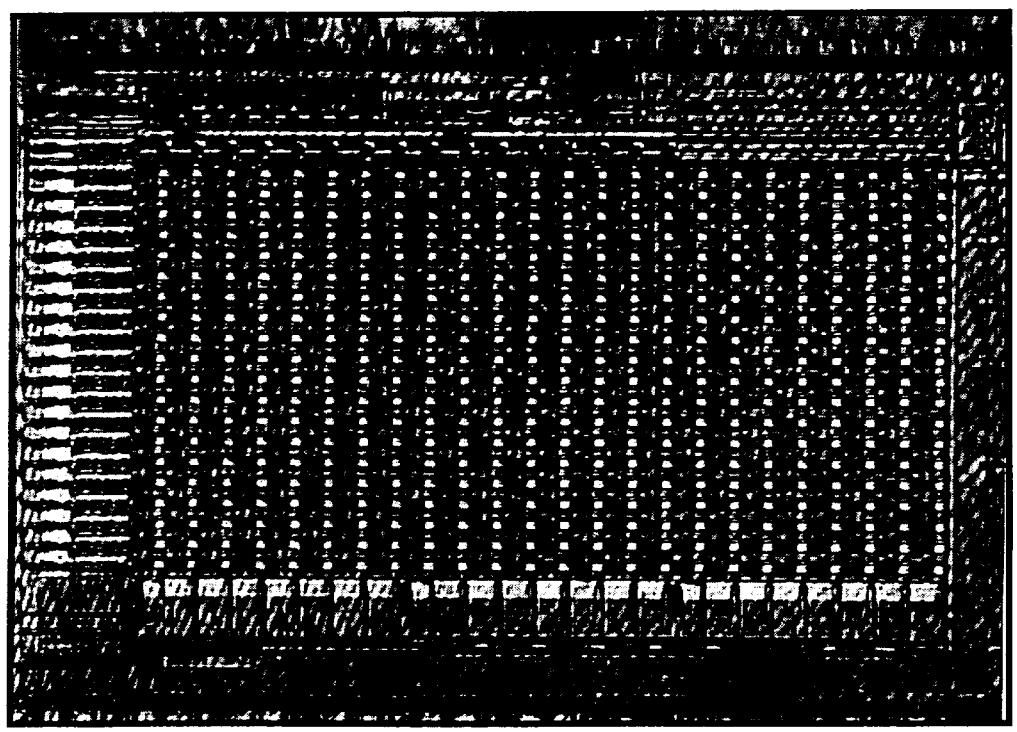

In testing the setup of FIG. 3b, the inventors used a black and white mask to imprint images on the signal beam 331. A first CCD camera (not shown) on the left side of the crystal cube 302 was used to capture the first reconstruction thereabove. A portion of the second reconstruction is reflected by the beam splitter 333 and is detected by a second CCD camera (not shown). FIGS. 3d and 3e show the first reconstruction and the second reconstruction, respectively. The second reconstruction by the phase conjugate beam 321 has better quality than the first reconstruction by the reference beam 320 since all the aberrations in the optical path of the phase conjugated beam 320 are automatically corrected and compensated.

Figure 3F:
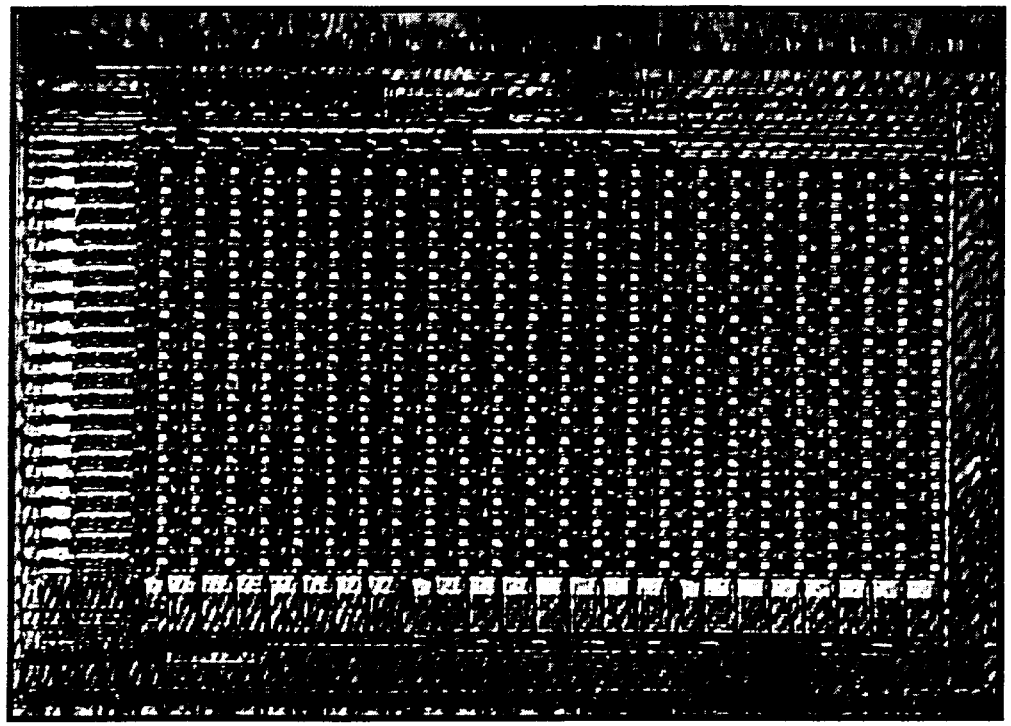
FIG. 3f shows the image of the pixel array on the OEIC chip in FIG. 3b captured by the first CCD camera.
Figure 3G:
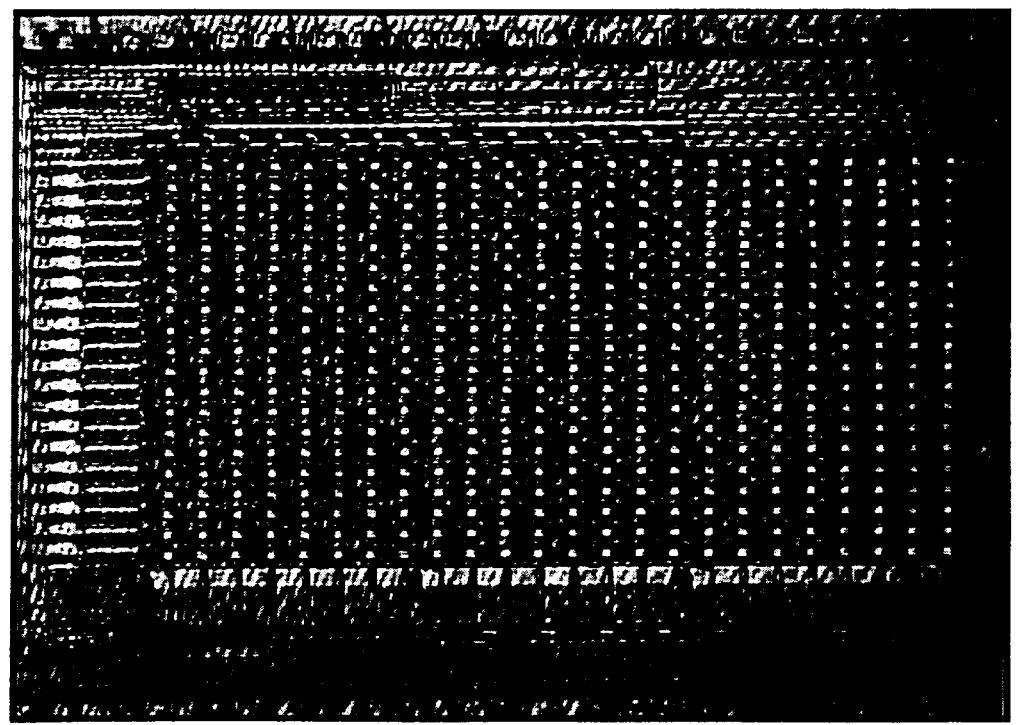
FIG. 3g shows the reconstruction image by the original reference beam.
Figure 3H:
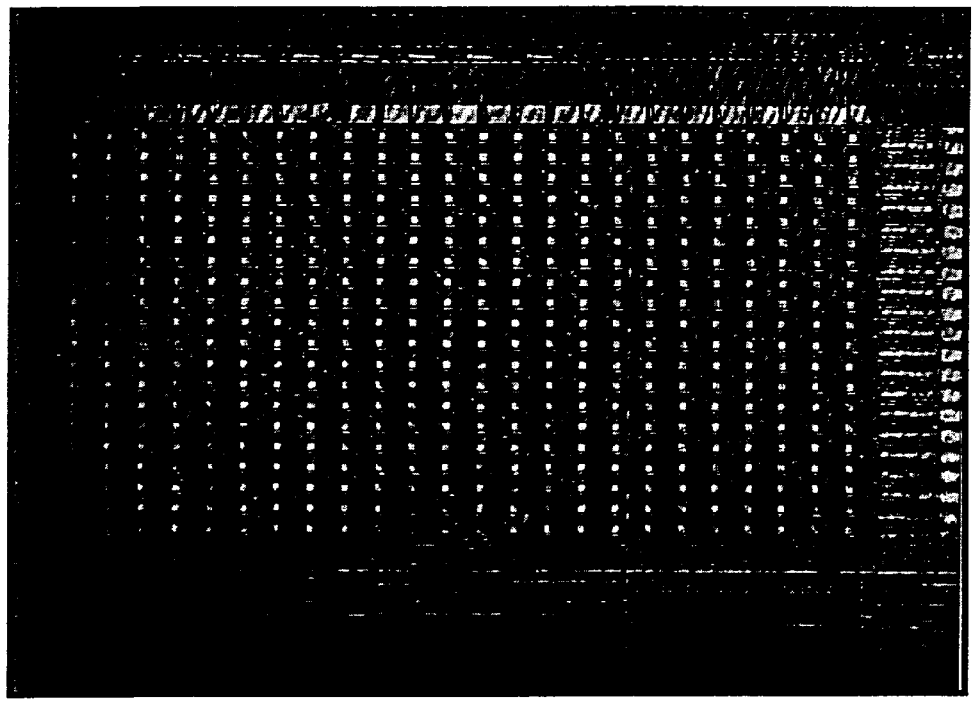
FIG. 3h shows the conjugate reconstruction image by the conjugate reference beam that is generated by reflecting the original reference using a mirror in the place of the phase conjugator in FIG. 3b.

The inventors further tested the setup of FIG. 3b using the OEIC 304 to directly modulate a portion of the signal beam 331 that propagates towards the OEIC 304. A reflecting mirror (not shown) was used to replace the phase conjugator 332 and reflect the reference beam 320 back to the crystal cube 302 as the conjugate reference beam 321. FIG. 3f shows the image of the pixel array on the OEIC 304 that was captured by the first CCD camera thereof. FIGS. 3g and 3h show the first reconstructed image by the reference beam 320 and the second (conjugated) reconstructed image by the conjugate reference beam 321, respectively.

Figure 3I:
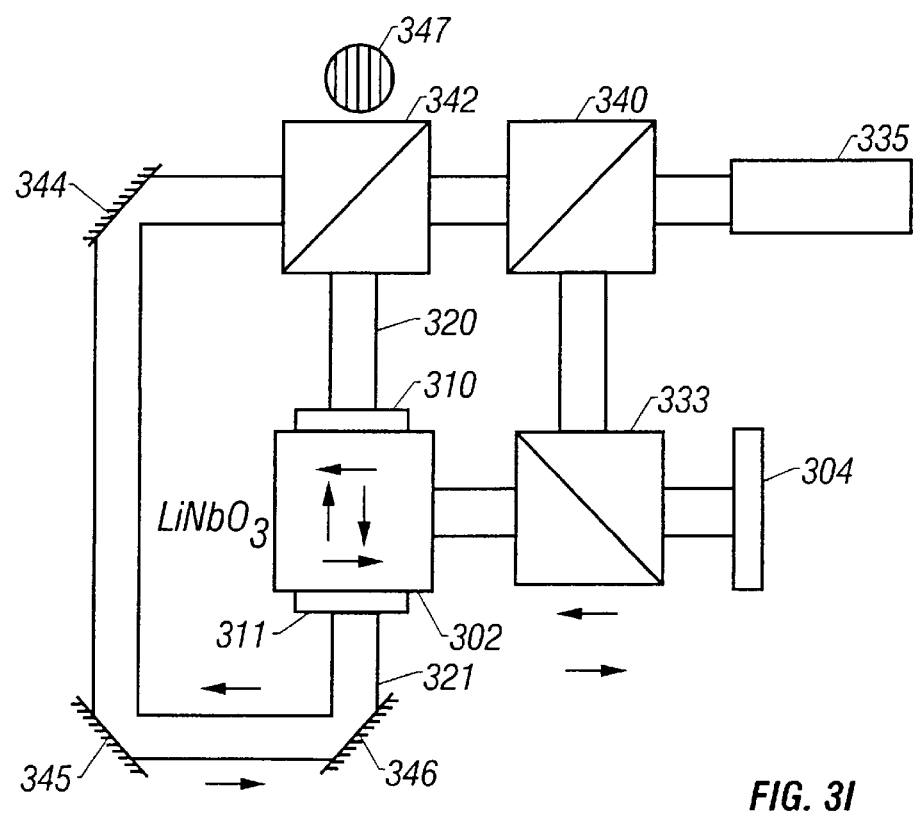
FIG. 3i shows another embodiment of the compact memory architecture based on angular multiplexing using a Sagnac self-ray-tracing geometry.

Another experimental compact system based on the architecture in FIG. 3a is illustrated in FIG. 3i. This geometry replaces the phase conjugator 332 with a loop to produce the conjugate reference beam 321. Multiple optical guiding elements (e.g., mirrors) are used to form the loop. An interference pattern 347 at a beam splitter 342 is used to determine whether the reference beams 320 and 321 exactly counter propagate. In recording a hologram, the reference beam 321 is blocked. In retrieving a hologram, the reference beam 320 is blocked. In comparison with the system in FIG. 3b, this system is less sensitive to erasure of the stored holograms since only beam 321 is present during readout but is more sensitive to misalignment of the optics. In addition, this system lacks some of the self compensation of aberrations that is inherent in the system of FIG. 3b.

Figure 3J:
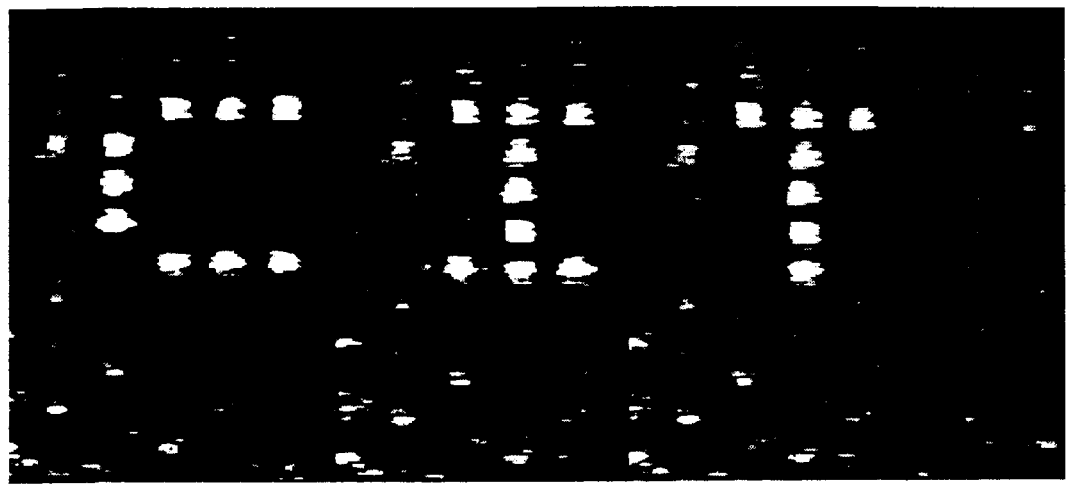
FIGS. 3j and 3k show the experimental results of the architecture in FIG. 3i.
Figure 3K:
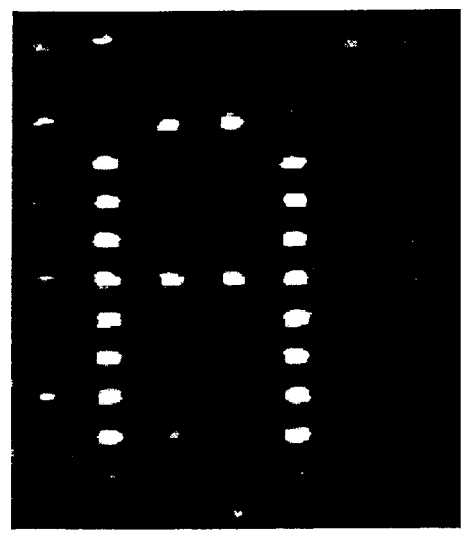

FIG. 3j shows the patterns displayed on the OEIC 304 that was captured by the first CCD camera on the left side of the crystal cube 302. FIG. 3k shows the conjugate reconstruction pattern captured by the second CCD camera.

Figure 4A:
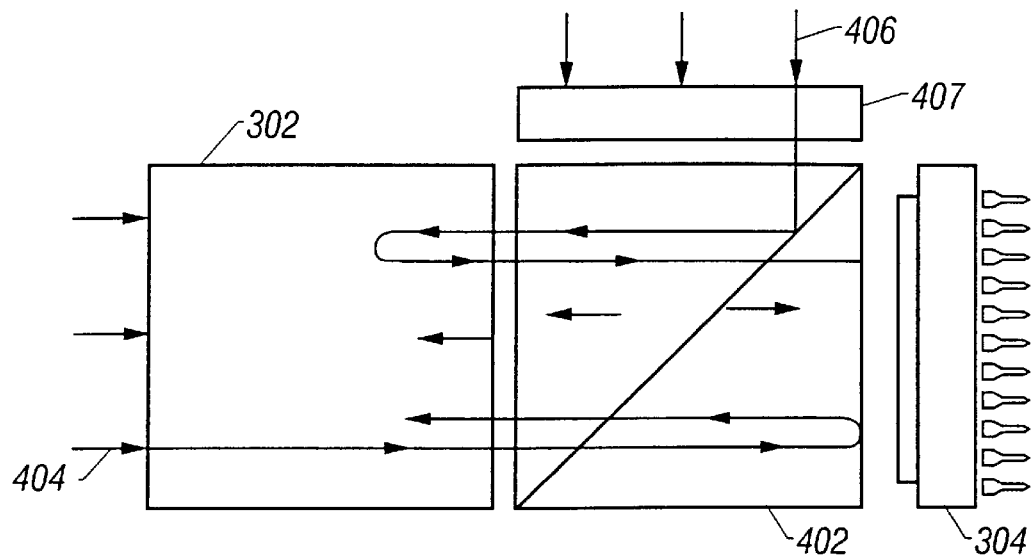
FIG. 4a shows one embodiment of the compact memory architecture based on wavelength multiplexing in a counterpropagating geometry.

The above compact architecture can be modified to implement wavelength multiplexing technique. FIG. 4 shows two preferred embodiments for a wavelength-multiplexed module of the present invention. FIG. 4a shows a system with a OEIC 304, a beam splitter 402, a beam steering element such as a DOE 407, and a photorefractive crystal cube 302. It employs wavelength multiplexing in the counter-propagating geometry that ensures an optimum wavelength selectivity. A single writing beam 404 is used to record holograms in the crystal cube 302. The writing beam 404 propagates through the crystal cube 302 and the beam splitter 402 and is modulated and reflected by the OEIC 304 to generate a counter-propagating signal beam which displays the bit pattern to be stored. The interference between the unmodulated reference beam 404 and the reflected counter-propagating signal beam records a hologram in the crystal cube 302. Different data pages are superimposed in the same volume and are recorded with slightly different wavelengths. During readout, a reference beam 406 for readout is shone alone on the beam splitter 402. The wavelength of the reference beam 406 is adjusted to match the wavelength that was employed to write the desired data page. The DOE 407 is used to bias the reference beam 406 at a small but preselected angle so that the reconstruction beam will go to the detectors in each pixel 306 on the OEIC 304 instead of the light modulators. The beam splitter 402 directs a portion of the reference beam 406 towards crystal cube 302 as the conjugate of the writing reference beam 404 employed to write the hologram. The resulting phase-conjugated reconstruction propagates back towards the OEIC 304, where it is detected and thresholded.

A single tunable diode laser can be used to generate both the writing beam 404 and the readout reference beam 406. Another possible compact light source for the above architecture is a pair of diode lasers with one generating the writing beam 404 and another one generating the readout reference beam 406.

Figure 4B:
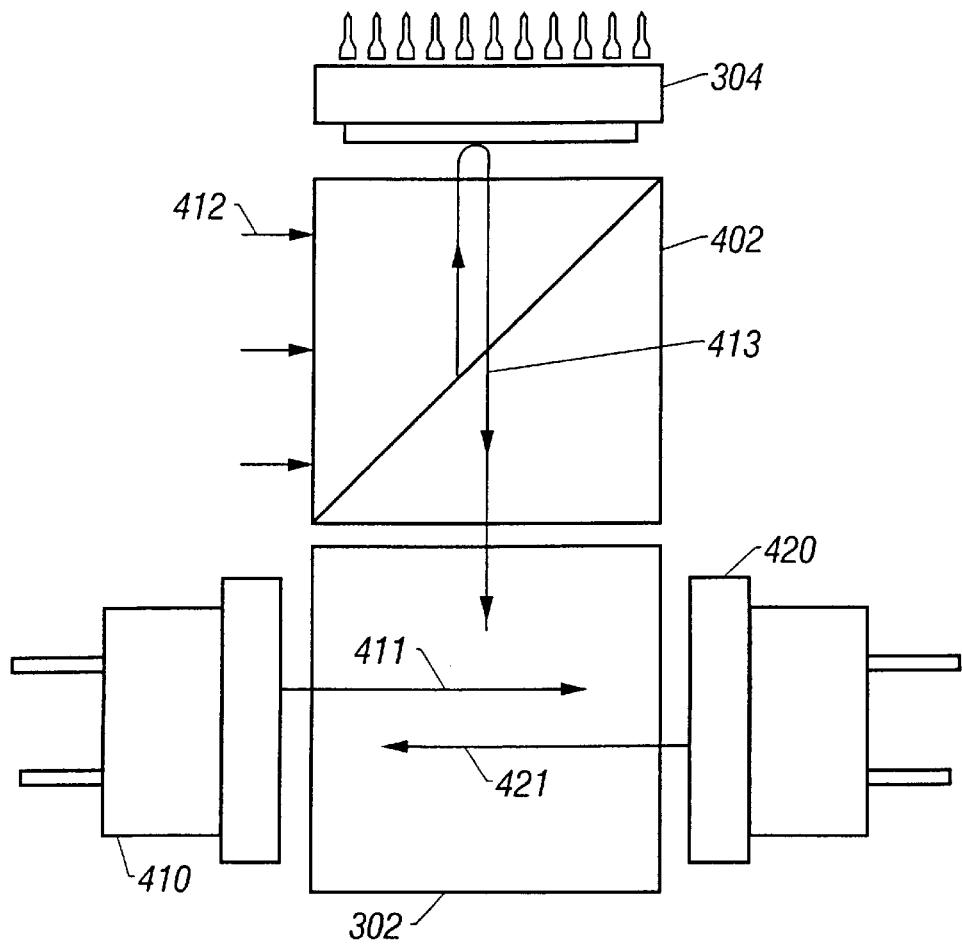
FIG. 4b shows another embodiment of the compact memory architecture based on wavelength multiplexing in a 90° geometry using two diode lasers to generate writing reference beam and reading reference beam, respectively.

FIG. 4b is another embodiment for a wavelength-multiplexed module of the present invention. A 90° geometry is employed. Two laser diodes, 410 and 420, are used to generate the writing reference beam 411 and the readout conjugate reference beam 421, which are preferably normally incident on the photorefractive crystal cube 302 from the left and the right, respectively. The laser diodes 410 and 420 can be attached to the crystal cube 302 on two opposing surfaces, respectively. A signal beam 412 that is in coherence with the writing reference beam 411 is directed to the OEIC 304 by the beam splitter 402 and is modulated by the OEIC 304. The reflected and modulated signal beam 413 propagates towards the crystal cube 302 in which it interferes with the writing reference beam 411 from the laser diode 410 to write a hologram. Different data pages are superimposed and stored in the same recording volume by using different wavelengths. Data pages stored in the crystal cube 302 are read out by illuminating the crystal cube 302 with the conjugate reference 421 at a proper wavelength. The diode laser 420 is disposed to set a small biasing angle in the direction of the read reference beam 421 such that the reconstruction beam will illuminate the detectors of the OEIC 304 rather than the light modulators therein.

Another alternative way to direct the conjugate reconstruction to the detectors on the OEIC 304 is to use a beam steering element (e.g., a DOE) that is positioned between the crystal cube 302 and the diode laser 420. The beam steering element operates to change the direction of the readout conjugate reference beam 421 entering the cube 302. This ensures that the phase-conjugate reconstruction goes to the detectors of the OEIC 304 and also that the data encoded therein be read out.

Figure 5A:
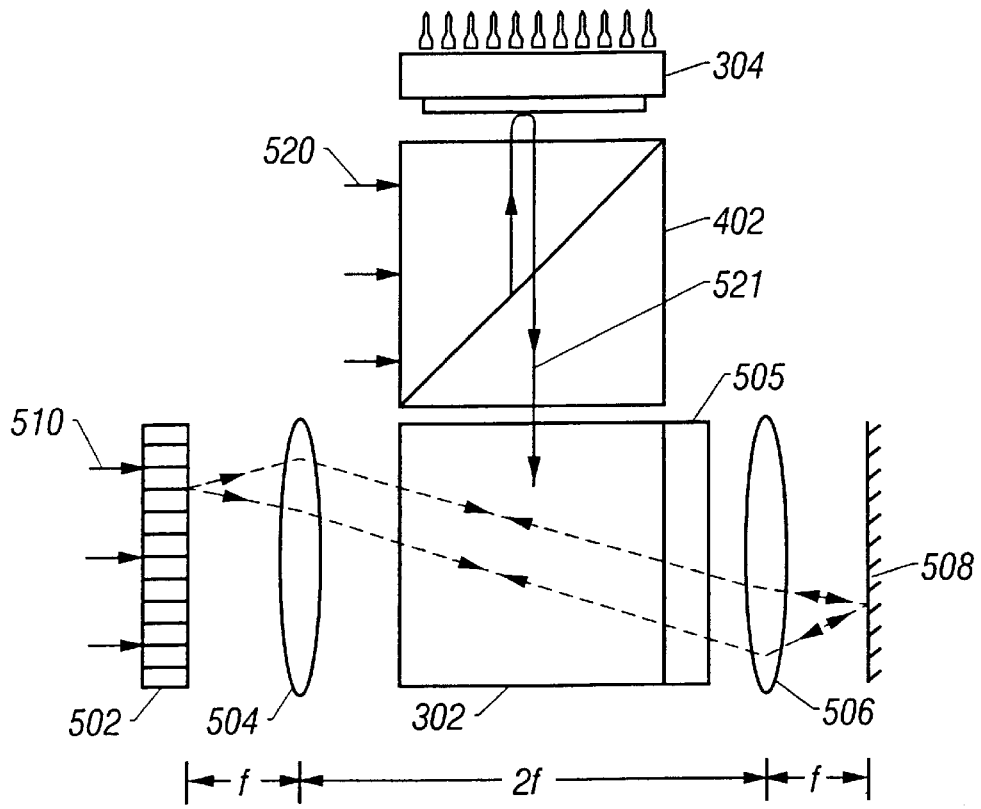
FIG. 5a shows one embodiment of the compact memory architecture based on phase-code multiplexing.

A phase-coded module in accordance with the present invention is preferably implemented in an architecture shown in FIG. 5a, which illustrates one embodiment of the architecture based on phase-code multiplexing. A portion of a signal beam 520 is modulated and reflected by the OEIC 304 to generate a writing signal beam 521 in the crystal cube 302. A reference beam 510 illuminates a phase spatial light modulator (phase SLM) 502, which imparts a different phase delay to each pixel therein. The phase modulator 502 is located in the front focal plane of a lens 504. If the pixels are small enough, the light beam emanating from each pixel can be thought of as a diverging spherical wave. The set of spherical waves becomes a collection of plane waves propagating at different angles upon traversing lens 504. All these plane waves are superimposed in the crystal cube 302 and write holograms by interfering with the writing signal beam 521. A different vector of phases, or phase code, is employed to record each data page. The phase codes have an orthognormal set in order to minimize the cross-talk during readout.

In retrieving a selected data page, the proper phase code employed to write that data page is displayed on the phase SLM 502. The reference beam 510 alone is used for readout. Due to the orthogonality property of the phase codes, only the desired data page is reconstructed coherently; partial reconstructions of the undesired data pages associated with individual plane waves interfere destructively and cancel each other out. Each plane wave can be made to retrace itself by adding a second lens 506 and a mirror 508 to form a 4-f system in the reference path (i.e., PSLM 502, lens 504, lens 506, and mirror 508). The desired phase-conjugate reconstruction propagates towards the OEIC 304, where it is detected. If the OEIC 304 has non-colocated detectors and modulators in the pixel array, a beam steering element 505 (e.g., a DOE) is used to bias the direction of the retracing reference beams inside the plane that is normal to the plane defined by the carrier of the signal beam and the center component of the reference array by a fixed and small amount so that the reconstruction will illuminate the detectors in the OEIC 304 in stead of the modulators therein.

Figure 5B:
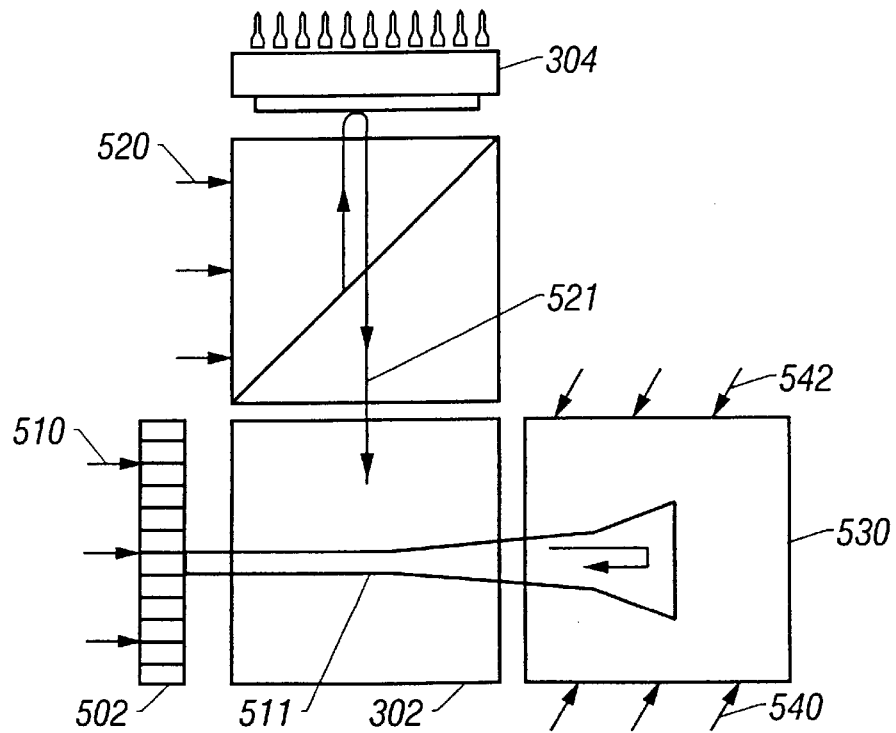
FIG. 5b shows another embodiment of the compact memory architecture based on phase-code multiplexing using a phase conjugator to generate the conjugate readout.

Another embodiment for the phase-coded module is shown in FIG. 5b. All the elements of this system are in contact and attached to each other. The lenses used in FIG. 5a are eliminated here. A nonlinear phase conjugation crystal 530 is used with two counter-propagating pump beams 540 and 542. A degenerate four-wave mixing process is employed here to generate a phase conjugate beam of the writing reference beam 510. This storage module employs a slightly different kind of phase-code multiplexing than that shown in FIG. 5a. The pixel structure of the phase SLM 502 divides the crystal cube 302 into a number of slices. During readout, the phase SLM 502 displays the phase vector employed to record the desired data page; the hologram ※ slices ※ corresponding to the desired data page add in phase, whereas those of other data pages add destructively due to the orthogonality of the phase codes. A self-retracing (i.e., phase-conjugate herein) reconstruction is obtained by conjugating the reference beam 510 using a four-wave phase conjugator. A simple mirror would not work here because the beams associated with each pixel of the phase SLM 502 would diffract. The angle of the counter-propagating pump beams 540 and 542 with respect to the direction of the reference beam 510 and the power the two pump beams 540 and 542 are adjusted to optimize the reflectivity of the phase conjugate mirror 530.

The phase modulator 502 can be programmed to add a small fixed biasing to the angle of the reference beam 520 during readout so that the phase-conjugated reconstruction by the phase conjugate reference beam will go to the detectors rather the modulators on the OEIC 304 having non-colocated detectors and modulators in the pixel array therein.

Figure 6A:
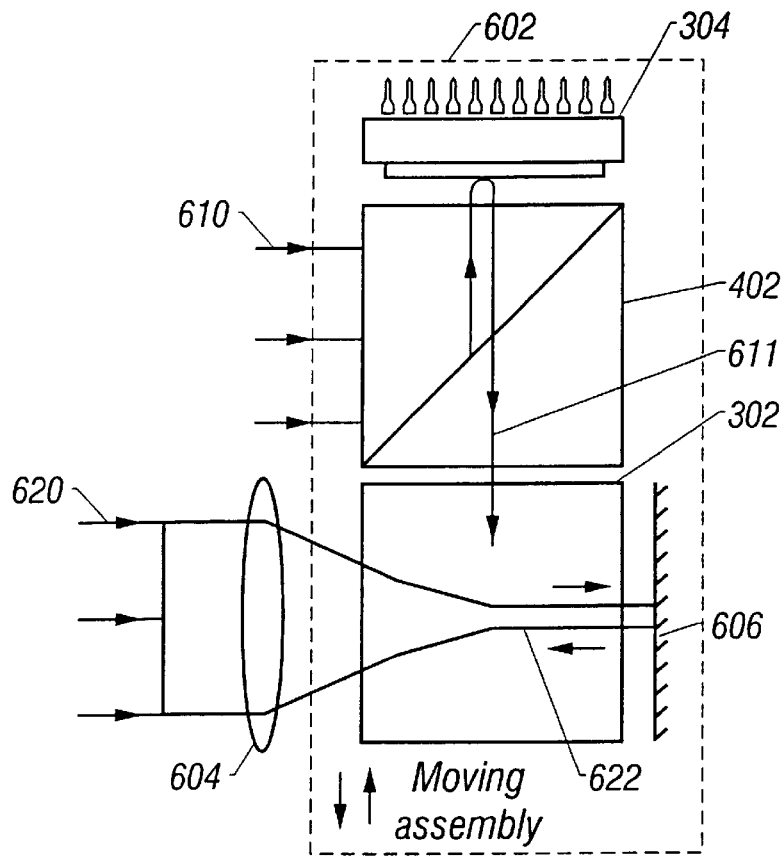
FIG. 6a shows one embodiment of the compact memory architecture based on shift multiplexing using a moving assembly.

FIG. 6a shows a preferred embodiment for the shift-multiplexed module in accordance with the present invention. This module employs the shift multiplexing to superimpose multiple holograms in the same recording volume. In this case, the reference beam 622 is a converging beam in the photorefractive crystal cube 302. This can be done with different methods such as by inserting a lens 604 in the path of a plane wave 620 as shown in FIG. 6. A signal beam 610 is directed to the OEIC 304 to generate a modulated signal beam 611 propagating towards the crystal cube 302. Interference between the converging reference beam 622 and the modulated signal beam 611 in the crystal cube 302 records a hologram. Multiple holograms are multiplexed essentially in the same recording volume by translating the recording medium, i.e., the crystal cube 302, perpendicularly to the propagation axis of the reference wave 622. In a typical system, the shift between holograms can be as small as a few micrometers. Self-retracing reconstructions are obtained by ※folding back※ the converging beam 622 using a beam shifting and reflecting element 606 which is positioned at the waist (focal point) of the beam 622. The element 606 reflects the beam back and shifts the reflected beam parallel with respect to the incoming reference beam 622 in the vertical direction (i.e. perpendicular to the plane defined by the signal carrier and the optic axis of the spherical reference beam) so that the conjugate reconstruction will illuminate the detectors in the OEIC 304 in stead of the light modulators therein. The shifting operation of the system for recording/addressing different holograms is accomplished by using a moving assembly 602 that carries the integrated package including the OEIC 304, beam splitter 402, crystal cube 302, and mirror 606.

Figure 6B:
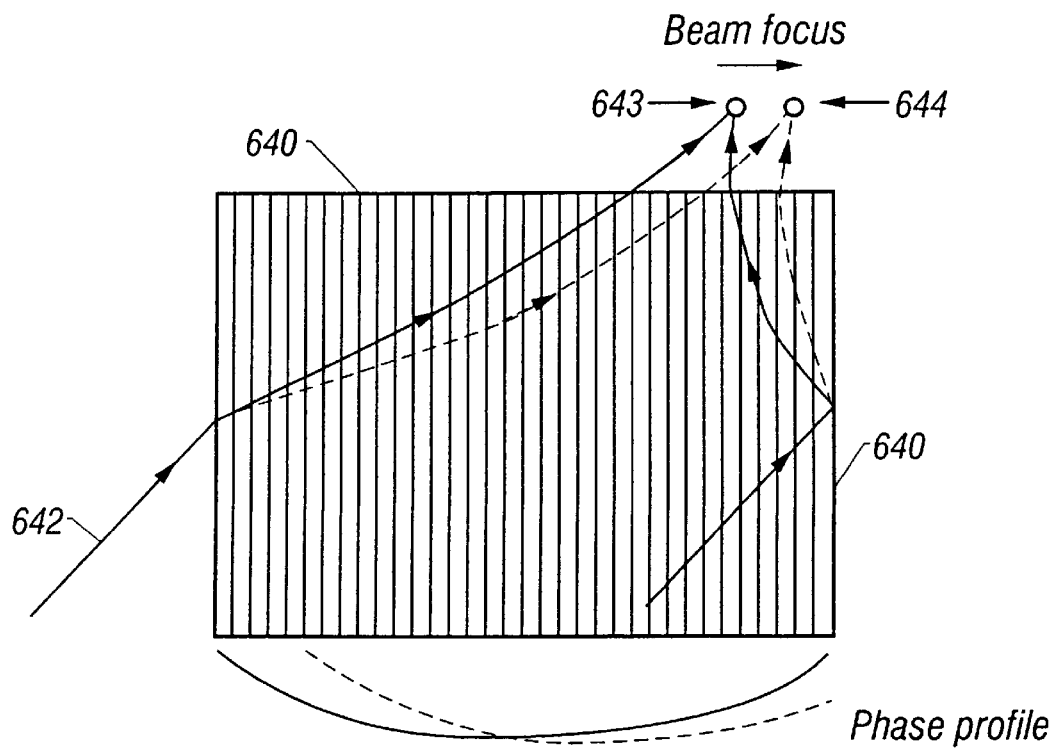
FIG. 6b shows one embodiment of the reconfigurable liquid crystal lens that is used for another compact memory architecture based on shift multiplexing.

Another mechanism for the shifting is to deflect the converging reference beam 622 with a reconfigurable liquid-crystal lens 640 as shown in FIG. 6b to eliminate the mechanical motion in the system of FIG. 6a. Such a system replaces the focusing lens 604 with the liquid-crystal lens 640 and eliminates the moving assembly 602. By using the voltage-controlled refractive index properties of liquid crystals, one can control the phase profile that is added to the incident beam 642 to the liquid-crystal lens 640. Consequently, by shifting the peak of the phase deviation, the focus of the resulting spherical wave can be shifted, for example, from point 643 to point 644. A more detailed description about this technique can be found in the following literature which is incorporated in this ! disclosure by reference: TERMINAL ADAPTIVE NEMATIC LIQUID-CRYSTAL LENS DEVIC, by Riza et al. in OPTICS LETTERS, Vol. 19(14), pp 1013–1015 (Jul. 15, 1994).

Figure 6C:
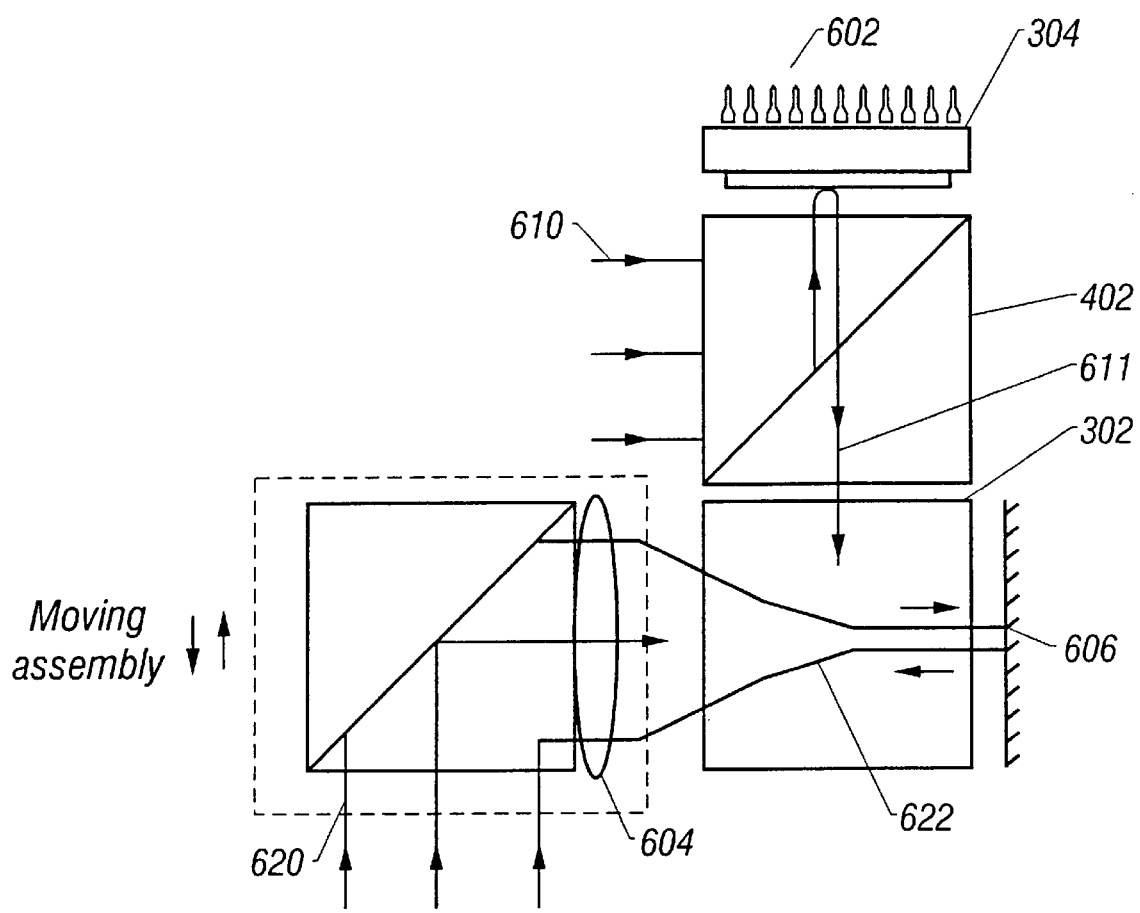
FIG. 6c shows one embodiment of the compact memory architecture based on shift multiplexing using a moving lens.

Another alternative way to implement the relative motion for shift-multiplexing is to leave the assembly 602 stationary but instead to move the focusing lens 604 and a beam-coupling mirror or a beam splitter. This is shown in FIG. 6c. The beam-coupling mirror or beam splitter operates to direct a incoming reference beam 620 that is perpendicular to the optic axis of the lens 604 to the lens 604 along its optic axis and thereby produce the beam 622.

The inventors also contemplate a configuration for a shift-multiplexing system to eliminate the mechanical motion. A regular beam steering element in combination with a Fourier-transforming lens is used to shift the reference beam 620. This again will have the effect of shifting the focus of the resulting spherical wave 622 in order to implement shift multiplexing. In all the above-described embodiments, a beam splitter positioned between the OEIC 304 and the photorefractive crystal cube 302 is desirable for conveniently injecting a signal beam to the OEIC 304 during a recording process. The inventors of the present invention found that this beam splitter can be eliminated by using fixed illumination holograms in the crystal cube 302 to generate a signal beam propagating towards the interface of the OEIC 304 with illumination of the reference beam 320. The illumination holograms allow the compact architecture shown in FIG. 3a to be implemented in all volume multiplexed holographic systems including angularly multiplexing, wavelength multiplexing, phase-coded multiplexing, and shift multiplexing.

Figure 7A:
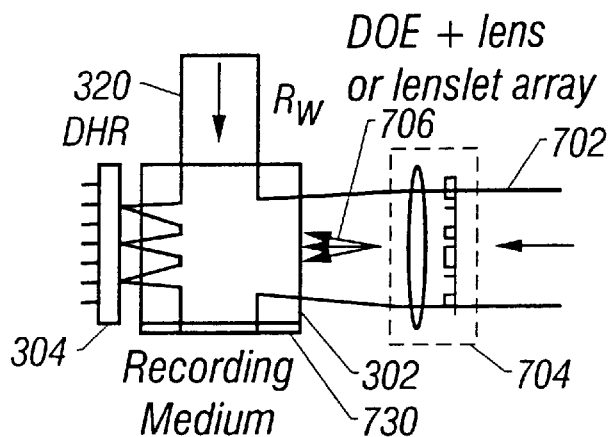
FIG. 7 illustrates one embodiment of the compact memory architecture using fixed illumination holograms.

FIG. 7 shows one preferred embodiment of the fixed illumination hologram architecture. In this architecture, the OEIC 304 and the photorefractive crystal cube 302 are directly integrated together, as shown in FIG. 3a without a beam splitter therebetween. FIG. 7a illustrates the recording of the fixed illumination holograms. The writing reference beam 320 and an array of beams 706 are used to record the fixed holograms. The array of beams 706 is comprised of converging beams, each focusing on a pixel of the OEIC 304. The beam array 706 can be generated, for example, by using a collimated beam 702 and an optical element 704. According to the present invention, a combination of a diffractive optical element and a lens or a lenslet array can be used as the optical element 704. The interference of the reference beam 320 and the beam array 704 creates the illumination holograms in the crystal cube 302. The resulting illumination holograms are fixed after the recording. If a photorefractive crystal is used, the holograms can be fixed thermally or electrically and will remain stable for a long period of time (several years). This recording process is part of the fabrication of the system.

Figure 7B:
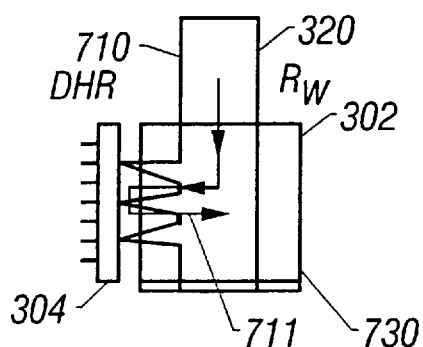

A new hologram with a 2D data page is recorded in the same volume of the crystal cube 302 where the fixed illumination holograms are stored. FIG. 7b shows the recording of the data from the OEIC 304 in the crystal cube 302. The reference beam 320 is used to impinge the fixed illumination holograms in the cube 302. The diffraction of the reference beam 320 by the illumination holograms produces an array of beams 710 to illuminate the pixels on the interface of the OEIC 304. The SLM in each pixel modulates each beam from the beam array 710 and reflects it back towards the crystal cube 302. All modulated and reflected beams form a beam array 711 that is coded with a data page. The interference of the beam array and the reference beam 320 records the data-bearing hologram. Multiple data-bearing holograms are stored in the same recording volume shared by the fixed illumination holograms by using the above-described volume multiplexing schemes.

Figure 7C:
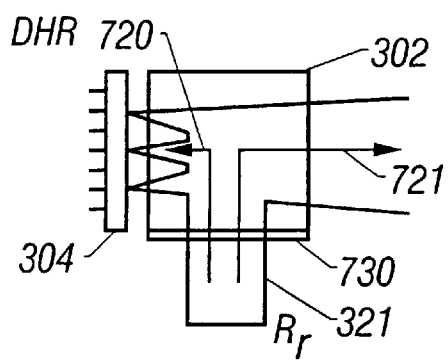

The data-bearing holograms are retrieved by using conjugate readout beam 321 as shown in FIG. 7c. The reference beam for readout, 321, propagating in the opposite direction of the writing reference beam 320, illuminates the crystal cube 302 to reconstruct the store holograms therein. A first conjugate reconstruction 720 propagates towards the OEIC 304 where it is sensed and processed. The conjugate reference beam 321 also produces a second reconstruction, the conjugate reconstruction 721 of the illuminating beam array 706 (a set of diverging waves propagating to the right, away from the OEIC 304 and the cube 302). The reconstruction 721 does not interfere with the detection process because the strong beams in 721 will not go towards the OEIC 304 and reach its detectors. However, this reconstruction is undesirable since it reduces the available power in the desired reconstruction 720.

A beam steering element, a DOE 730, is integrated to the surface of the crystal cube 302 from which the conjugate readout beam 321 enters the cube 302. This is to add a small biasing angle in the direction of the beam 321 so that each converging reconstruction beam in the reconstruction 720 propagating towards the OEIC 304 will fall on the detector in each pixel rather than the light modulator.

The fixed illumination hologram architecture further facilitates the integration of the compact architecture of the present invention in addition to other benefits. For example, a single beam 320 is sufficient to provide the holographic reference and to illuminate the pixels of the OEIC 304 to generate the holographic signal beams 711. No beam splitter is required and the beam routing is simple. The power of the input beams is used efficiently since the beams focus on the modulators of the OEIC 304 and photons are not wasted on optically inactive parts of the pixels.

Dynamic Hologram Refresher for the Compact Architecture

One building block of the compact architecture for holographic systems of the present invention is the smart pixel opto-electronic integrated circuit (OEIC). The preferred embodiments of the present invention have an OEIC that integrates the functions of a reflective SLM for recording holograms and a detector array for readout. As described previously, this OEIC operates with other components to record multiple data pages in the system and includes structures allowing randomly retrieval of any selected data page. In addition, this OEIC can be used to refresh the holograms of a read/write memory system as in an electronic dynamic RAM: the memory needs to be periodically refreshed by reading its contents and writing them back. Such an OEIC of the present invention is called a Dynamic Hologram Refresher (DHR). A DHR in accordance with the present invention is a smart pixel structure that has an electrically addressed SLM for writing a new data page, a thresholding detector array for readout, and a memory for latching the data from the detector to the modulator in each pixel.

The light modulators used in the DHR are preferably liquid crystal modulators fabricated on VLSI dies which are compact, low-cost, energy efficient, and easy to fabricate. Such liquid crystal modulators can be assembled on mass-produced conventionally fabricated silicon VLSI dies using a small number of simple post-processing steps. Liquid-crystal-on-silicon (LCOS) modulators provide high-contrast, low-power modulation of optical beams throughout the visible and near infra-red range. They provide analog or binary (thresholding) modulation of either the amplitude or the phase of an incident readout beam, at speeds of several tens of kilohertz. Such speeds are ample for most optoelectronic memories and neuromorphic systems, considering the parallelism allowed by optics and the speed limitations typically imposed by other system components or by the target information processing task. Contrast ratios in excess of 15:1 are commonly achieved. Switching energies per pixel are typically in the femtojoule to picojoule range; the low driving voltages required by liquid crystal modulators are compatible with complementary metal-oxide semiconductor (CMOS) VLSI circuits.

Smart pixels are readily implemented by combining mature, reliable silicon CMOS VLSI technology with LCOS modulators. Advanced information processing circuits can be compactly integrated within each pixel, because of the high density and yields achieved by modern CMOS VLSI processes. Photodetectors with good responsivity and speed are easily implemented in most such processes, usually without further post-processing. They can detect incoming optical data signals and transform them into electrical signals that are passed to the CMOS information processing circuits, which in turn produce an optical output by driving a region of the liquid crystal film above the die. The liquid crystal modulator structure does not need to define individual pixels; this task is instead accomplished by assigning the individual metal electrodes to the pixels, formed by using one of the native metalization levels of the CMOS VLSI process, whereas a single electrode, common to all pixels, is provided by the cover plate. Thus, in most cases, lithography is not required in the post-processing procedure that yields the modulator structure; this reduces the cost and the complexity of the procedure.

Figure 8:
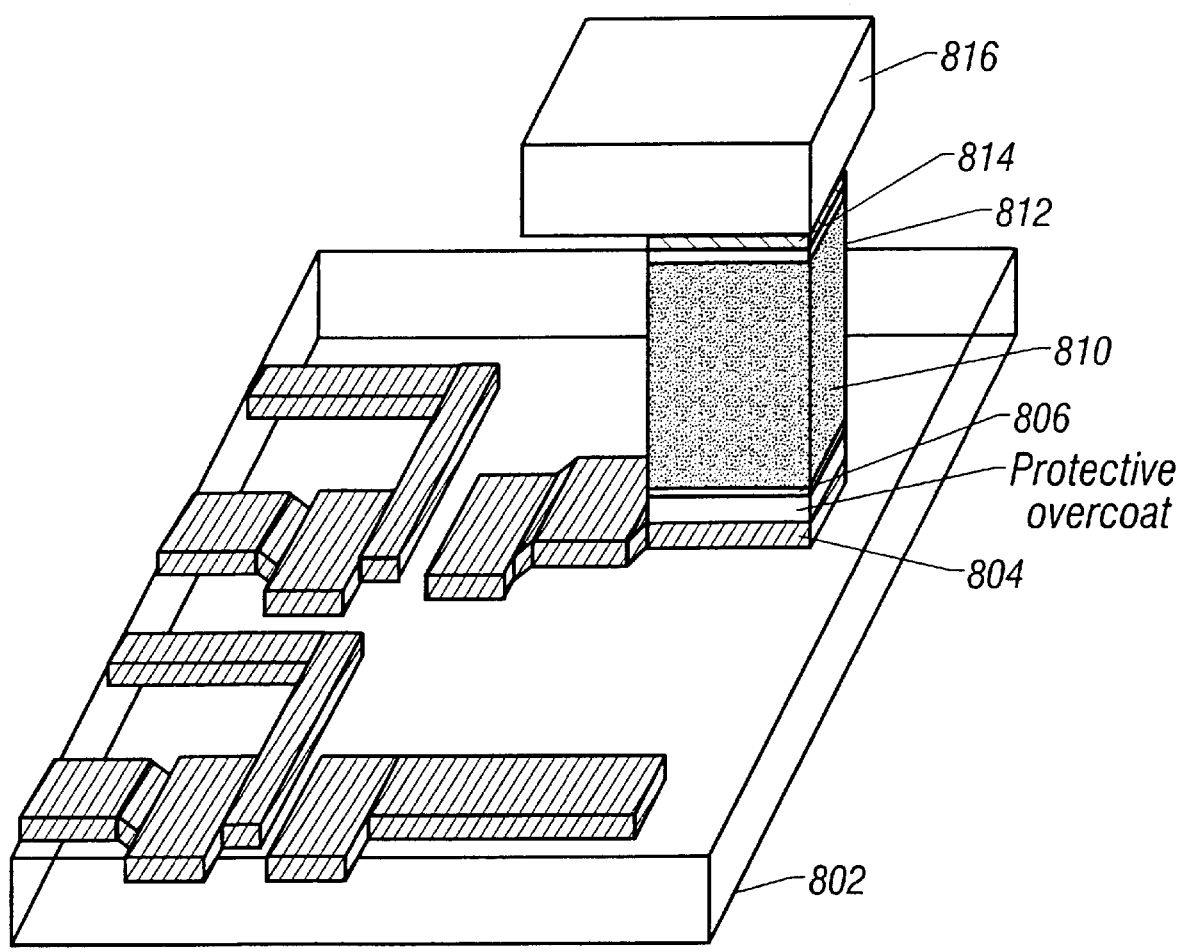
FIG. 8 shows one example of the liquid crystal modulator on silicon that is used in the DHR of the present invention.

FIG. 8 shows a preferred embodiment of the liquid crystal modulator that is used in the DHR in accordance with the present invention. This is a hybrid-aligned nematic modulator and is assembled on top of a conventionally processed VLSI die 802. Such modulators can be built on CMOS integrated circuit dies fabricated using a double-metal double-poly n-well CMOS process available through MOSIS. Octadecyltriethoxysilane(OTS), a surface coupling agent 806 that induces homeotropic alignment of the neighboring nematic film, is spun on the die 802 (as received from the semiconductor foundry) and baked at 120 to 200 degrees Celsius for about 30 minutes. OTS binds to the silicon dioxide protective overcoat 807 that was deposited by the foundry. This low temperature operation does not affect the electronic properties of the integrated circuit, and can even be performed on a packaged die. A cover plate 816, coated with an indium-tin-oxide (ITO) transparent conductor 814 and with rubbed polyimide 812 (a surface coupling agent inducing homogeneous alignment), is then affixed to the die 802, at a distance of 4 μm to 10 μm, set by a mixture of optical adhesive (Norland 61) and precision glass fiber spacers. The adhesive is cured by a brief exposure to long-wave UV radiation. The resulting cavity is filled with a mesogenic substance 810 in the isotropic phase, and then slowly cooled down to the nematic phase. The director field smoothly varies from a horizontal orientation close to the cover plate 816 to a vertical orientation on the surface of the die 802, as a result of the competing boundary conditions (hence the name hybrid-aligned nematic: and of the elasticity of the material. This conformation provides a phase retardation between the eigen modes excited by a normally incident plane wave; the retardation is a function of the cell gap and the birefringence and elastic constants of the nematic 810.

Additional information regarding such modulators that can be used in the DHR of the present invention can be found in the following literature which is incorporated by reference in this disclosure: Jean-Jacques P. Drolet et al., "Hybrid-Aligned Nematic Liquid-Crystal Modulators Fabricated on VLSI Circuits", Optics Letters, Vol.20, No.21, pp.2222–2224, 1995.

Figure 9:
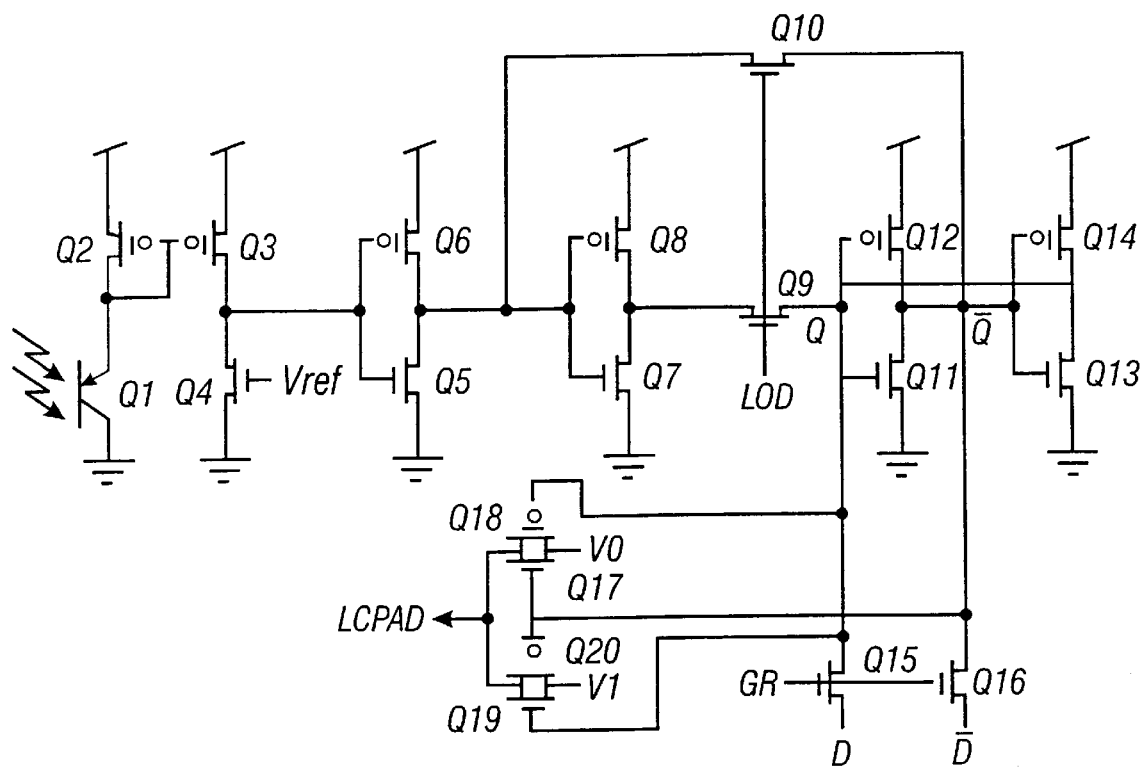
FIG. 9 is the preferred embodiment of the DHR-4 pixel circuit.

FIG. 9 is the schematic of the first embodiment of the DHR in accordance with the present invention. This is a circuit of the DHR-4 pixel that was developed for conjugate readout and compact modules with lens-less data paths in holographic memory systems. This Dynamic Hologram Refresher includes an array of 20×24 pixels. It was fabricated through MOSIS using a 2.0 μm double-metal n-well CMOS process. Each pixel measures 132 μm×211 μm. The pixel circuitry of FIG. 9 is divided among three main functions: detection of optical signals, memory, and optical modulation. A static memory bit (regenerative latch) having two cross-coupled CMOS inverters (Q11–Q14) is at the core of the pixel. This memory bit determines which of two signals, $V_o$ or $V_1$ drives the pixel's liquid crystal modulator electrode (LCPAD), via an analog multiplexer having two CMOS transmission gates (Q17–Q20). The modulator is "on" when driven by $V_1$ and "off" when driven by $V_o$. The memory circuit can latch data presented either optically through Q1–Q10 or electronically via the complementary column signals (D and $\overline{D}$,) and the NMOS switches Q15 and Q16, enabled by the gate row GR. The gate row GR is produced by the row address decoders. The state of the latch is read by allowing Q11–Q14 to drive the column signals (in this case, the column drivers, at the bottom of the pixel array, are turned off).

Q1 is an active-well-substrate PNP bipolar junction phototransistor with a floating base. Q2 and Q3 form a current mirror that isolates the threshold computation from the detection process. Q2–Q4 are normally operated in the weak inversion (subthreshold) regime, where the drain-source current is an exponential function of the gate-source voltage. Therefore, the voltage at the emitter of Q1 does not vary by more than a few hundred millivolts over the entire optical power input range, and the collector-base junction of Q1 is always strongly reverse biased. Q3 and Q4 form a programmable threshold circuit with current input and voltage output. The level of the threshold is set by $V_{ref}$. Q5–Q8 are two CMOS inverters that sharpen the threshold characteristic of the circuit and avoid loading the analog front end when optical data are latched. Q9 and Q10 are NMOS transmission gates activated by LOD (Load Optical Data). When LOD is asserted, the complementary outputs of the two inverters to the left of Q9 and Q10 drive the regenerative latch (Q11–Q14).

The DHR-4 works well and is energy efficient. Optical patterns have been latched in the on-chip memory with less than 100 fW incident on each phototransistor. Cost of fabrication is low since it is implemented by using an inexpensive 2.0 μm double-metal n-well CMOS process. The 2.0 μm process also limits the number of pixels that can be incorporated in a die since each pixel is about 23000 μm². The inventors believe that a more advanced process using the same scalable design rules and providing a 0.35 μm minimum feature size could yield a pixel size of 16.6 μm×16.6 μm um.

The inventors found that the significant savings in pixel area can be achieved by employing a 3-metal process with a small feature size of 0.35 μm. An even higher pixel density could be obtained by using a more aggressive pixel design. One important motivation for increasing the number of pixels per data page is the fact that the pixel diffraction efficiency $\eta_{pixel}$ Of the holograms (the ratio of the power diffracted into one pixel area to the reference wave power) goes as $$\eta_{pixel} \propto \frac{1}{M^2 N}, \quad (3)$$

where M is the number of holograms and N is the number of pixels per page. Hence, given a fixed light budget (i.e. a fixed minimum diffraction efficiency, determined by the optical input power and the sensitivity of the photodetectors), the maximum storage capacity MN is achieved by storing as many pixels as possible within each hologram. An attempt to store the same amount of data using more holograms and fewer pixels per hologram would not provide enough light to the photodetectors, because of the quadratic dependence of diffraction efficiency per pixel, $\eta_{pixel}$, on the number of holograms M.

The inventors found that some additional pixel efficiency savings can be obtained by eliminating some of the buffering and isolation transistors (e.g. Q2, Q3, Q5 and Q6) and by employing only NMOS transistors in the transmission gates that drive the liquid crystal modulator. This is done at the cost of a less effective DC balancing and hence a potentially shorter modulator lifetime. Extensive additional savings can also be achieved by foregoing the convenience of employing a static memory and by sharing some pixel components between all three functions of the pixel: optical detection, memory, and optical modulation. The number of MOSFETs can be decreased to four or two depending on the available optical power.

Figure 10:
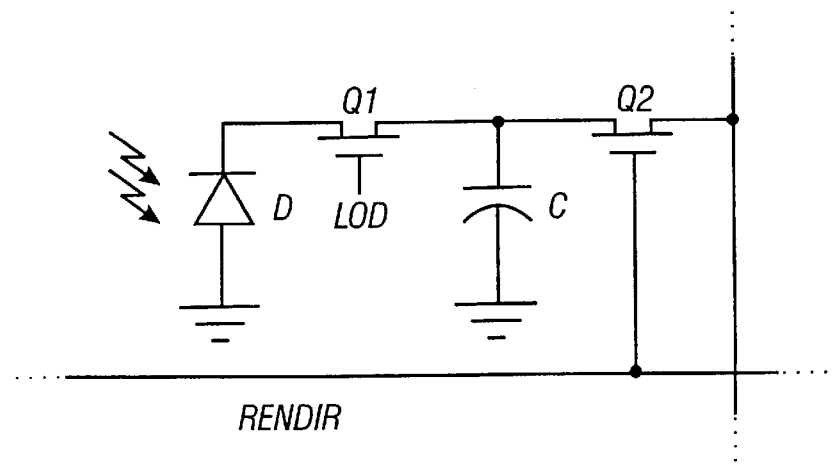
FIG. 10 is the preferred embodiment of the two-transistor DHR pixel circuit.

FIG. 10 shows the second embodiment of the DHR in accordance with the present invention, a two-transistor pixel design. This is a very compact pixel circuit having a photodiode D, a capacitor C and two NMOS transistors, Q1 and Q2. The liquid crystal electrode is connected to the common node of Q1, Q2 and C. Q2 and C form a conventional dynamic RAM cell. The capacitor C stores a charge that represents one bit of data. All the cells in a column of the cell array share a column line, employed to read, write and refresh data stored in the cells. All the cells in a row share a row addressing circuit that generates a row enable signal, RENDIR. At most one row is selected at any given time. Q2 connects C to the column line when RENDIR is asserted. The data stored on the capacitor can be read by monitoring the change in the voltage of the column line using a sensitive amplifier. New data is written in the cell by driving the column line (and the pixel's capacitor) to a desired voltage level. The charge stored on the pixel capacitors must periodically be refreshed, because it slowly decays due to leakage currents and parasitic conductances. This is accomplished by reading the data stored in an entire row into a 1-D temporary storage array at the bottom of the main array, and rewriting the data into the row. The refresh period of modern dynamic memories typically ranges from 32 ms to 128 ms. The storage capacitance C is ordinarily a few tens of femtofarads.

A small cell architecture, having one MOSFET and one capacitor (Q2 and C), also forms the pixel circuit of a simple active-matrix dynamic liquid crystal display. Each pixel stores the voltage needed to drive one pixel. The rows are addressed in succession. The columns are driven with the voltages to be assigned to an entire row of pixels. The RENDIR signal of that row is asserted (all the other rows have RENDIR=0) to allow the capacitors to "memorize" the desired voltages. RENDIR is then deasserted, and the process is repeated for another row. In a spatial light modulator, the rows must be addressed periodically not only because of the decay of the stored charges, but also because liquid crystal modulators must be driven with DC-balanced signals at a frequency typically of the order of 1 kHz. DC-balancing the driving signals helps in obtaining a long display lifetime. It is believed that the selective ion trapping happens in the liquid crystal alignment layers if the polarity of the signals is not inverted frequently enough. The transistors and capacitors can be fabricated on transparent substrates such as glass coated with polycrystalline or amorphous silicon (this is the case of most advanced transmissive liquid crystal displays), or on a silicon die in liquid-crystal-on-silicon (LCOS) modulators.

When data must be displayed (i.e. when recording or refreshing a hologram), the two-transistor DHR pixel in FIG. 10 uses Q2 and C in the same fashion as the corresponding elements would be employed in an active-matrix display pixel. It uses the same components much as a dynamic RAM during readout. The capacitor C is also employed to detect optical signals. Optical detection proceeds in two steps. First, all the capacitors are charged to a known voltage. Then, LOD is asserted, turning Q1 on, while the RENDIR signals of all the rows are close to 0 V. In each pixel, the charge stored on the capacitor is discharged through the photodiode D, which acts as a current source controlled by the optical power incident on the pixel. More specifically, the photocurrent flowing through the diode (provided by the capacitor) is $$I_{ph} = \frac{Pe\eta}{hv}, \quad (4)$$

where P is the incident power, e is the electron charge, $\eta$ is the quantum efficiency of the detector, h is Planck's constant, and v is the frequency of the light. The voltage change on the capacitor is $$\Delta V = \frac{I_{ph} t_{int}}{C}, \quad (5)$$

where $t_{int}$ is the integration time. Equations (4) and (5) are valid if $I_{ph}$ is considerably larger than the currents due to leakage and parasitic conductances and the voltage stored on the capacitor at the end of the integration period is still significantly larger than the "thermal voltage" kT/e, which is about 25 mV at room temperature, where k and T are respectively Boltzmann's constant and the absolute temperature of the photodiode. At the end of the integration time, LOD is deasserted, and the rows are successively read using the mechanism described above for a dynamic RAM. If the holograms needs to be refreshed, the logic levels read from the pixel array are converted into appropriate liquid crystal voltages and written to the array, one row at a time.

Clearly, the capacitor C is shared between the three functions of the pixel: optical detection, optical modulation and memory. Only two MOSFETs and one photodetector need to be added to form a complete dynamic DHR pixel. In comparison, the static DHR-4 pixel shown in FIG. 9 has 19 MOSFETs and one phototransistor. Notice also that the two transistors are of the same type (native or n-channel) and that there are no connections to the upper supply rail. Therefore, there is no need to diffuse n wells in the p substrate (assuming an n-well process) or to devote area to well plugs. Wells are expensive in terms of silicon real estate, because native and well transistors must be separated from their boundaries by a sizable distance. Moreover, only one supply rail (ground) must be distributed to the pixel array.

The price to pay for this drastic reduction of the number of components in the pixel circuit is a more complex on-chip support circuitry. For example, when a data page must be latched in DHR-4's internal memory, it suffices to pulse LOD high. The data will remain in the regenerative latch (Q11–Q14 in FIG. 9) as long as the device is powered, and can be read out at the convenience of the circuit that requests the read operation. In the case of a DHR based on the two-transistor pixel architecture in FIG. 10, the pixel capacitors must first be precharged. Then, LOD must be pulsed high for a carefully controlled integration time $t_{int}$. Finally, the data must be read out promptly from the pixels before the capacitors discharge. The pixel readout process is also itself slightly more complicated than in the case of DHR-4; the latter provides complementary signals with rail-to-rail voltage swings, while the former uses single-ended column lines in the interest of compactness. The increased complexity, however, is not prohibitively expensive. The area of the control functions grows roughly as the square root of the number of pixels. Its development cost would be largely offset by the significantly improved pixel density provided by the two-transistor architecture of FIG. 10.

FIG. 10 has a small voltage swing produced by low optical input power. This can be alleviated to some extent by sacrificing speed for sensitivity, but the integration time must remain significantly less than the dark decay time of the charge stored on C. Small voltage changes are difficult to detect because of the large capacitance of the column line. The capacitance to ground of the pixel storage node is small (in a dynamic RAM, it is only of the order of 15 fF to 50 fF, to minimize the silicon area devoted to the capacitor), whereas the column line has a large capacitance, consisting of contributions from the metal line itself, from source/drain diffusions and from the gates of the CMOS circuits connected to the line. When a pixel is read, the stored charge is redistributed between the pixel capacitance and the column line capacitance; the effect of this redistribution is that the optically generated voltage swing is multiplied by $$\frac{C}{C + C_{line}}, \quad (6)$$

which is much smaller than one.

Figure 11:
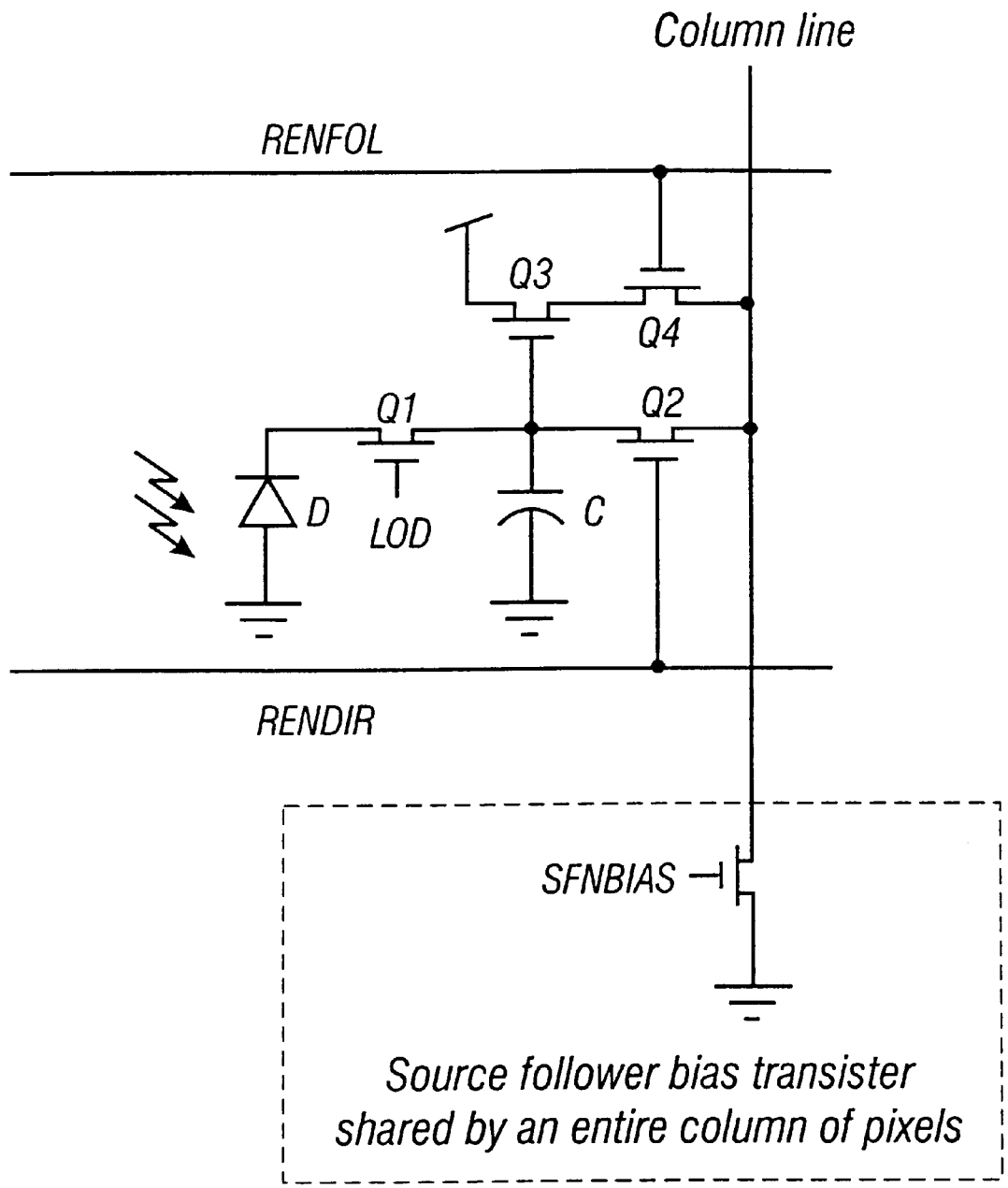
FIG. 11 is the preferred embodiment of the four-transistor DHR pixel circuit.

FIG. 11 shows the third embodiment of the E)HR in accordance with the present invention. This four-transistor design can overcome certain shortcomings of the two-transistor design of FIG. 10. This pixel is similar to that shown in FIG. 11, except for the addition of two n-channel MOSFETs, Q3 and Q4. The operation of the circuit is similar to that of the two-transistor pixel as described previously. The difference is mainly in reading out optical signals.

When a data page is read out, the pixel capacitor is precharged to the voltage of the column line by pulsing RENDIR high and the photocurrent is integrated on C during the LOD pulse. However, the resulting charge is not sensed by sharing it with the column line; instead, a source follower, i.e., a voltage amplifier with a gain close to unity, buffers the voltage and drives the column line. The input transistor of the source follower is Q3. A single bias transistor is shared by all the pixels in a column of the array. At most one input transistor is connected to (put in series with) the bias transistor at any time: transistor Q3 of the pixel at the intersection of the column and the selected row (RENFOL=1). The row addressing circuit of the selected row generates an active (high) RENFOL. This turns on Q4, and connects Q3 to the source follower bias transistor of the column to which the pixel belongs. RENFOL=0 in all the other rows. The output voltages of the selected row of pixels appear at the drains of the source follower bias transistors (one per column). Note that the charge stored in the pixel is not shared with the column line. It is instead buffered by a source follower, which drives the column line by charging or discharging it with its saturation current. This circuit is susceptible to errors due to threshold variations of Q3. However, this can be compensated for using double-correlated sampling (the precharge voltage, as buffered by the source follower, is subtracted from the optically generated signal).

The circuit shown in FIG. 10 can perform all the functions of the DHR-4, with only 4 MOSFETs, one photodiode and one capacitor. Note that all the transistors are still of the same type; there is therefore no need for an n-channel well. Moreover, area can be saved by laying out the source of Q1 as an extension of the cathode of the photodiode (assuming an active-substrate photodiode is employed). Likewise, the source of Q3 and the drain of Q4 can be a shared area of active, with the gates of the two transistors separated by the minimum poly-poly separation ($2\lambda$ in the MOSIS scalable CMOS rules). This circuit requires only 64 $\mu m^2$ in area if it is fabricated with a 0.35 $\mu m$ DRAM process.

Liquid Crystal Diffractive Optical Element

The beam steering element used in the above compact architecture is a programmable diffractive optical element (DOE). In particular, a DOE based on a blazed grating phase profile using liquid crystals is preferred to accurately control the direction of the light entering the holographic cube. The period of the grating controls the deflection angle.

Figure 12A:
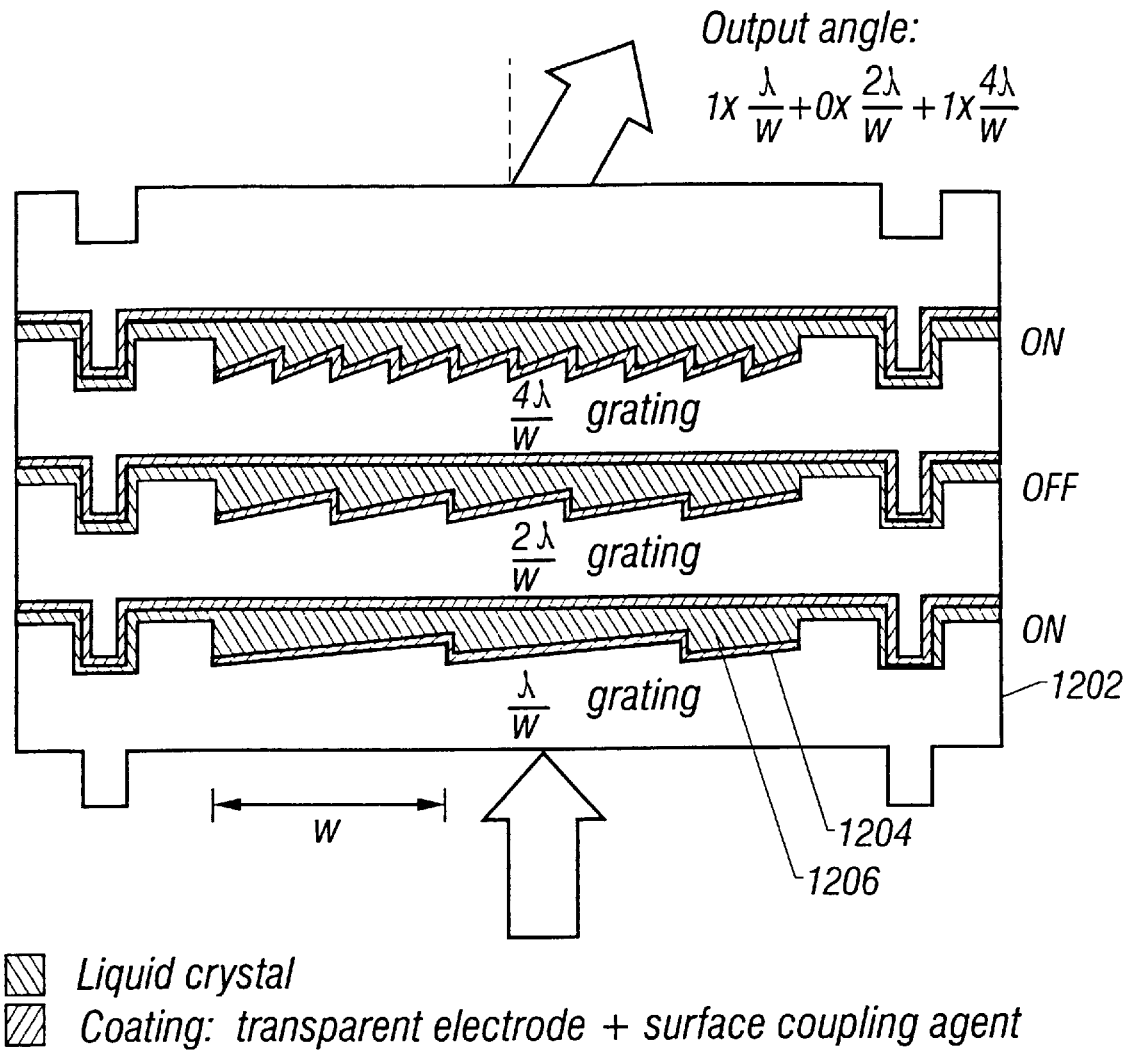
FIG. 12 shows the preferred embodiment of a programmable DOE based on a blazed gratings and liquid crystal material in accordance with the present invention.

According to the present invention, a DOE with liquid crystal grating is made by etching a blazed grating in one of the substrates of the liquid crystal cell, and to reveal or hide the grating using the liquid crystal as an electrically switched index matching fluid. This is shown schematically in FIG. 12 where a substrate, an etched grating, and the liquid crystal are indicated by 1202, 1204 and 1206, respectively. A large number of deflection angles are obtained by cascading several such gratings. The number of output angles grows exponentially with the number of gratings in the stack. A stack of three such gratings are shown in FIG. 12.

Figure 12B:
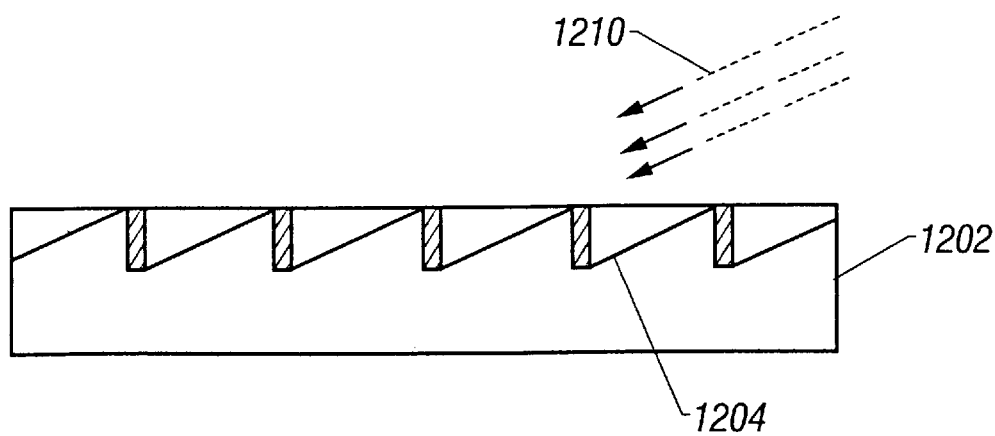

The fabrication of the DOE having a cascade of n gratings is as follows. The first step is to etch blazed gratings with the appropriate spatial frequencies in n glass plates. This can be done using conventional binary optics fabrication techniques (m discrete etches to obtain $2^m$ phase levels). For short grating periods, for which binary optics techniques are difficult to use, a process shown in FIG. 12b is used in accordance with the present invention. An array of deep and narrow trenches, matching the spatial frequency of the desired grating, is obtained using a highly anisotropic etching technique such as reactive ion etching. These trenches are then filled with metal and seed a second etching step using an oblique particle beam 1210. The metal in the trenches acts as a stop-etch layer during this step. Finally, the metal is removed. Additionally, microscopic fingers and wells facilitating the interlocking assembly of the stack can be defined while the gratings are formed. A transparent conductor such as indiumtin oxide (ITO) is sputtered on the glass substrates, which are then coated with a liquid crystal alignment film. The stack is assembled with the help of the interlocking structures and filled with liquid crystal by capillary action.

A beam steerer capable of producing $2^n$ resolvable output angles is obtained by cascading n switched blazed gratings, whose spatial frequencies increase as powers of two from the entrance side to the exit side of the stack. Each element of the stack can be made to either diffract light or simply let light through, depending on the voltage applied to this particular element. If the wavelength (in vacuum) of the radiation is $\lambda$ and the birefringence (or usable index tuning range) of the liquid crystal in $\Delta n$, the step height of each grating is $\lambda/\Delta n$.

This technique for the fabrication of blazed gratings of the present invention has several advantages compared to competing techniques. It features more robustness to lithographic imperfections, less stringent processing requirements and fewer electrical connections than devices employing multiple electrodes per grating period, and considerably more speed than macroscopic wedges. Lithographic defects cause a "graceful degradation" of the properties of the device (diffraction efficiency, beam quality), but small defects do not cause the device to be inoperative.

According to the present invention, a beam deflector capable of steering an input beam to any of 1024 resolvable angular locations has ten electrically switched blazed gratings, each with a step height of $\lambda/\Delta n$. If $\lambda=532$ nm (e.g., frequency-doubled Nd:YAG) and $\Delta n=0.15$, a step height of 3.5 $\mu$m can be obtained. The periods of the gratings range from 8 $\mu$m to 4.1 mm. The maximum deflection angle (at 532 nm) is 7.6 degrees.

Different types of liquid crystals can be employed in accordance with the present invention. Devices using inexpensive off-the-shelf nematic liquid crystals switch in a few milliseconds and have a simpler fabrication procedure. More advanced materials provide response times in the order of 40 microseconds but are more difficult and expensive to fabricate.

Conjugate Readout and Pixel Design of DHR

One of the advantages of conjugate readout in holographic systems of the present invention is that a single optoelectronic device can be employed for both optical input and optical output. For example, the DHR OEIC in accordance with the present invention can act as a spatial light modulator while recording or refreshing holograms, or as a detector array during readout operations in a holographic memory. In the latter case, because the phase-conjugate signal beam being read out self-focuses back onto the OEIC, pixel-by-pixel alignment is guaranteed, and no imaging optics are required. This has been disclosed in various embodiments herein.

Many OEIC technologies require the optical input areas (e.g., photodetectors) and output areas (e.g., modulators or emitters) embedded within each pixel of an OEIC to be spatially separate. FIG. 3c illustrates such a configuration of the OEIC in accordance with the present invention, in which the light modulator and the light detector in a pixel displace from each other. This is the case, in particular, of the increasingly popular liquid-crystal-on-silicon (LCOS) technologies. When recording holograms, only the output areas (modulators or emitters) represent useful information. When information is retrieved from a hologram, the areas of the reconstructed page having encoded information need to be sensed by the optical inputs of the OEIC. However, phase-conjugate readout in accordance with the present invention produces a reconstructed data beam that faithfully reproduces the phase profile of the original writing signal beam, with the result that the parts of the reconstruction in which information is encoded are focused on the optical output areas of the OEIC rather than the desired optical input areas on the OEIC. Therefore, the information cannot be properly sensed. Various techniques in conjugate readout are disclosed herein to ensure that the conjugated reconstruction is properly sensed by the optical input areas of the OEIC having a pixel design of displaced detector and modulator. In angularly multiplexed systems, for example, the desired shift can be obtained using a simple electrically controlled optical wedge (e.g. using liquid crystals).

The inventors of the present invention further devised pixel designs of the OEICs having co-located optical inputs and outputs, thus simplifying the conjugate readout. For example, one solution is to employ an OEIC technology that allows the same elements to be used alternatively as optical inputs and outputs. This is possible, when diodes are employed as optical outputs, as in self-electrooptic effect devices (SEED) and vertical cavity surface-emitting lasers (VCSEL). The output device can be operated as a regular photodiode during readout.

The inventors found that optical input and output functions are temporally non-overlapping in many holographic systems; therefore, sharing devices between these functions does not necessarily impair the bandwidth of the systems. Moreover, merging optical input and output functions in one device can significantly improve the pixel density and fill factor of the OEIC. A better fill factor in turn decreases the insertion loss of modulator-based (e.g. SEED) OEICs illuminated by a uniform beam, since a larger fraction of the illuminating power is modulated.

One of the technologies that potentially provide the best fill factor is Lucent Technologies' Hybrid SEED process. The SEEDs are fabricated on a gallium arsenide (GaAs) chip which is flip-chip bonded to a silicon die. The GaAs chip contains only SEED modulators, while the rest of the electronics is integrated on the silicon chip. After the bonding operation, the GaAs substrate is removed, leaving only the SEED modulators on top of the silicon die. A single SEED (or two if differential signaling is employed) can lie over most of the silicon electronics implementing the pixel functions. A more detailed description of the SEED design and operation is given by the following publication, which is incorporated herein by reference: K. W. Goossen et al., "GaAs MQW modulators integrated with silicon CMOS," IEEE Photonics Technology Letters 7(4), 360–362 (1995).

SEEDs and VCSELs for holographic information storage and processing systems in accordance with the present invention desirably have their operating wavelengths within the responsive spectral range of the rewritable holographic materials. Progress has been made on the holography front in the development of long-wavelength read/write holography (e.g. materials sensitive in the red and infra-red with long dark decay, two-photon recording) and on the device front (e.g. solid-state lasers emitting at shorter wavelengths). In implementing VCSELs in a holographic systems in accordance with the present invention, an efficient phase-locking mechanism is desirable to ensure their coherence with the reference beam since they are emitters (instead of modulators). This can be done, for example, using injection-locking.

The inventors recognized the difficulty in having co-located detectors and modulators in an LCOS structure such as the one in FIG. 8 herein because the reflective metal electrode that controls the liquid crystals is located above the silicon substrate, while photodetectors are fabricated on the surface of the substrate. Therefore, light normally could not reach detectors under the modulator areas. The inventors found that there is one technique that can make the LCOS have co-located detectors and modulators and hence be useful for the conjugate readout without the readout biasing mechanisms. A fine grid pattern can be made in the LC electrode, so that it can still control the liquid crystal, while also allowing some light to reach the underlying photodetectors. The inventors demonstrated this idea in a neural net OEIC employing ferroelectric liquid crystal modulators. A small amount of defocusing or shift of the reconstruction beam using a programmable DOE is desirable to ensure the reconstruction is sensed by the detectors. A description of this technique can be found in "Optoelectronic Chip for the Implementation of Back Error Propagation", by Hsin-Yu Li, Jean-Jacques P. Drolet, Demetri Psaltis, and Mark A. Handschy, in IEEE/LEOS Meeting, Santa Barbara, Calif., August, 1992.

Applications of Compact Architecture

The compact architectures in accordance with the present invention can be implemented in a variety of optoelectronic systems for a wide range of applications. Examples of such applications listed as follows are intended to illustrate the versatile of the present invention and should not be construed to limit the applications of the present invention.

1. Parallel-Accessible Distributed Database

Figure 13:
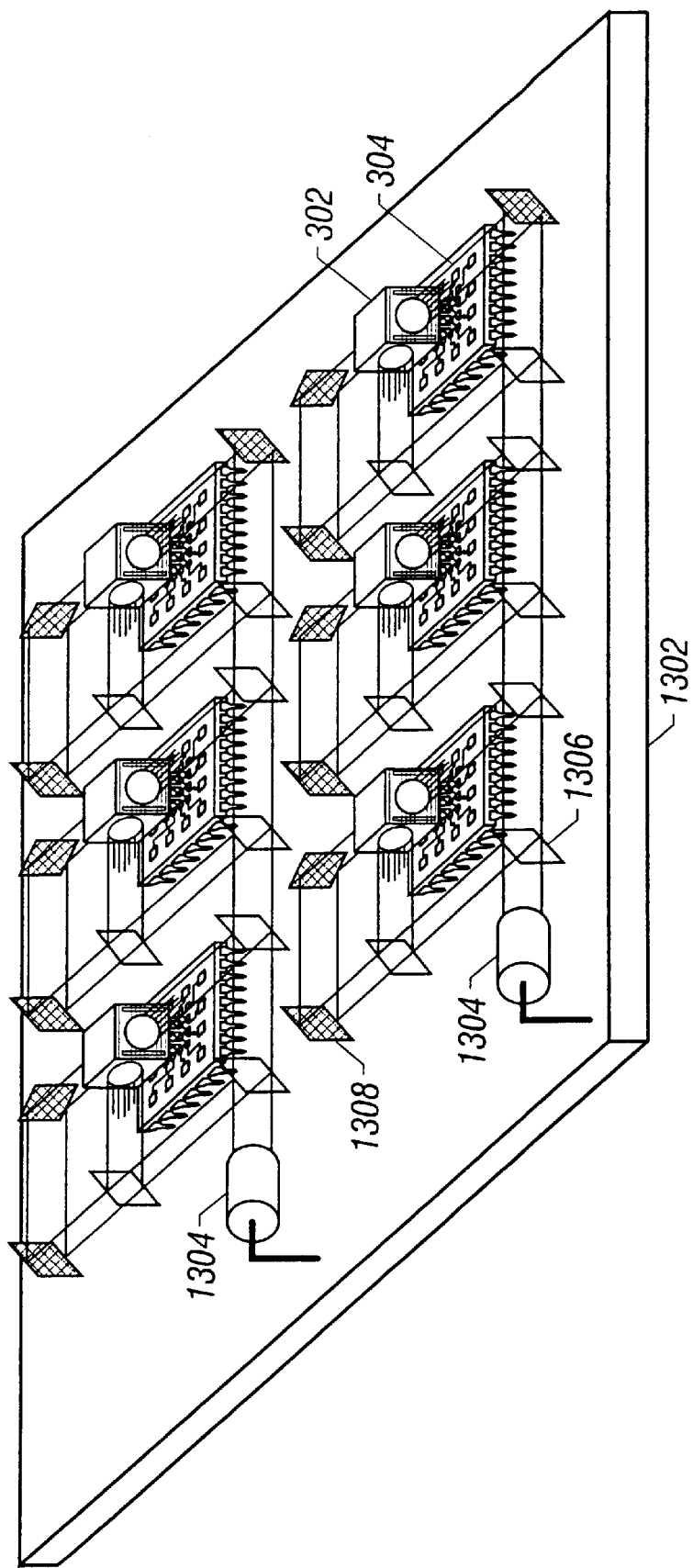
FIG. 13 is one embodiment of a database using the compact memory architecture in accordance with the present invention.

Arrays of storage modules described herein can be assembled on circuit boards to yield systems capable of storing several terabytes of data. FIG. 13 shows a high-performance holographic random-access memory (HRAM) as a database using multiple compact modules in accordance with the present invention (e.g., the module shown in FIG. 3a). A circuit board 1302 has a surface to support a plurality of such modules that are arranged in a grid (e.g., 100 modules). A diode laser 1304 on the circuit board 1302 produces a laser beam that drives multiple modules. Beam splitters 1306 and mirrors 1308 are integrated on the board 1302 to route the laser beam to each module. The optoelectronic integrated circuits 304 that are part of the modules are connected electronically to support the electronic circuitry on the circuit board 1302, while the holographic crystals 302 and other module components (e.g., DOEs) attached thereto form an optoelectronic over-layer that stores the data.

Such Holographic memory systems offer significant advantages over traditional memory architectures such as optical disks (e.g., CD-ROM's and Digital Video Disks), magnetic memories (e.g., magnetic tapes and disk drives), and integrated silicon memories (e.g., DRAM's, SRAM's, ROM's, etc.). For example, such database systems have a large storage capacity that is difficult to achieve with other storage systems, parallel and random access, and fast accessing speed. Each module as shown in FIG. 3a can have a capacity of approximately 2 Gbit (1 Mbit per hologram, 2000 holograms multiplexed). As many as 100 modules can fit on the board 1302, resulting a very competitive capacity of 200 Gbits. This system is very fast because the modules may exchange information between each other and with the external sources at the rate of approximately 1 Gbit/sec (integration time of 1 msec per hologram).

2. Integrated Neural Network

Figure 14:
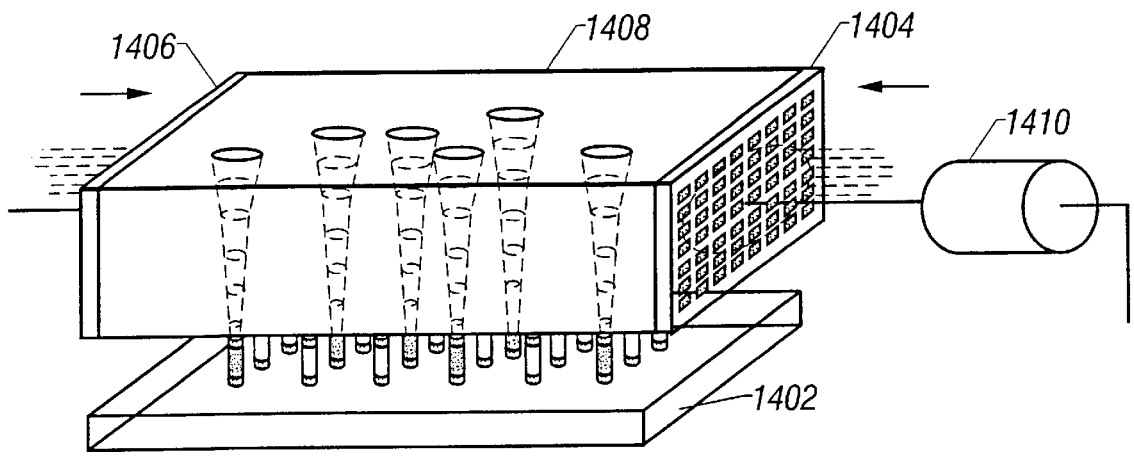
FIG. 14 shows an integrated neural network using the compact architecture in accordance with the present invention.

The integration of optoelectronic devices with holographic medium that are shown in the preferred embodiments of the present invention can be applied to form an integrated neural network as illustrated in FIG. 14. A monolithic array of vertical cavity surface-emitting lasers (VCSEL) 1402 and two spatial light modulators 1404 and 1406 are attached to three surfaces of a rectangular parallelepiped holographic medium 1408. The VCSEL array 1402 is phase-locked with a master laser oscillator 1410 using a feedback scheme. Each VCSEL corresponds to a different neuron. Learning is accomplished by displaying input patterns on the SLM 1404, which interfere with the diverging beams emanating from the VCSEL's. Inner products are obtained by displaying the input pattern on SLM 1406 facing SLM 1404. The self-retracing inner product beams naturally focus on the VCSEL's, which are also used as detectors.

Note that no lenses are required in this system, resulting in a very compact and easily fabricated package. In a system with fixed interconnection weights, only one spatial light modulator is needed after the learning phase. Alternatively, self-electrooptic-effect devices (SEED) or liquid crystal modulators can also be substituted for the VCSEL array 1402, in which phase locking is not required and the modulators can be illuminated with an external light source.

3. Integrated Crossbar Switch

Figure 15:
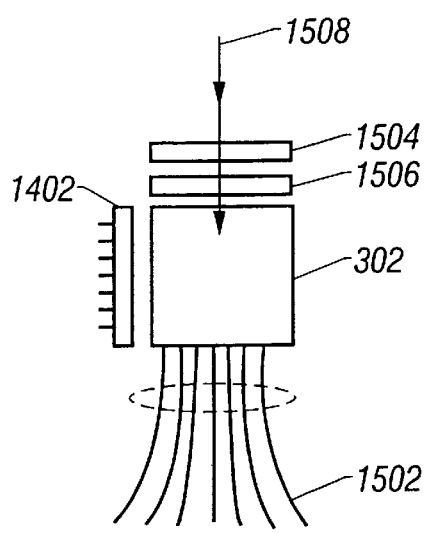
FIG. 15 shows a programmable crossbar switch using the compact architecture in accordance with the present invention.

FIG. 15 shows a programmable crossbar switch based on the integration of optoelectronic devices with holographic medium in accordance with the present invention. The device operates to address pixles in the input plane to the different units in the output plane. A 2D array of phase-locked VCSEL's 1402 is holographically coupled to a 2D array of fibers 1502 by the holographic medium 302. A reference beam 1508 is used to record holograms in the recording medium 302 by interfering with light beams emitted by the pixels on the array 1402. The direction of a reference beam 1508 entering the holographic medium 302 is controlled by two beam steering elements 1504 and 1506. Alternatively, the two beam steering elements can be replaced with one beam steering device that is capable of steering a beam in both x and y direction. Individual fibers are addressed with angularly multiplexed holograms that are recorded by changing the direction of the reference beam 1508. Many addressing schemes are possible such as one pixel to one fiber, multiple pixels to one fiber, one pixel to multiple fibers, and multiple pixels to multiple fibers. In addition, different interconnection topologies are achieved by wavelength-multiplexing different sets of angularly multiplexed holograms. In a normal switching operation, the reference beam 1508 is not used. New holograms are recorded by using the reference beam 1508 to reconfigure the switch.

An alternative approach is to use a 2D liquid crystal modulator array and an illumination laser to replace the VCSEL array 1402.

4. Multifunctional Associative Holographic Memories

Artificial neural networks were proposed as early as 1943 as an alternative to traditional von Neumann-type computers. A neural network is composed of a number of relatively simple computational units organized in layers with interconnections between the layers. The computation is defined by the strength of the interconnects. The neural network approaches asymptotically the desired performance ("training") by updating the interconnects. Because of their adaptive properties and parallelism, neural networks are suitable for applications that are too hard to program with traditional means, or when a model for the physical phenomenon is missing or too complicated to construct. Neural networks require high parallelism by nature, so they are well suited to optical implementation. The inventors of the present invention disclose herein a compact implementation of a particular type of neural network, an associative memory with multiple functions, based on a modified compact holographic memory architecture in accordance with the present invention.

Figure 16:
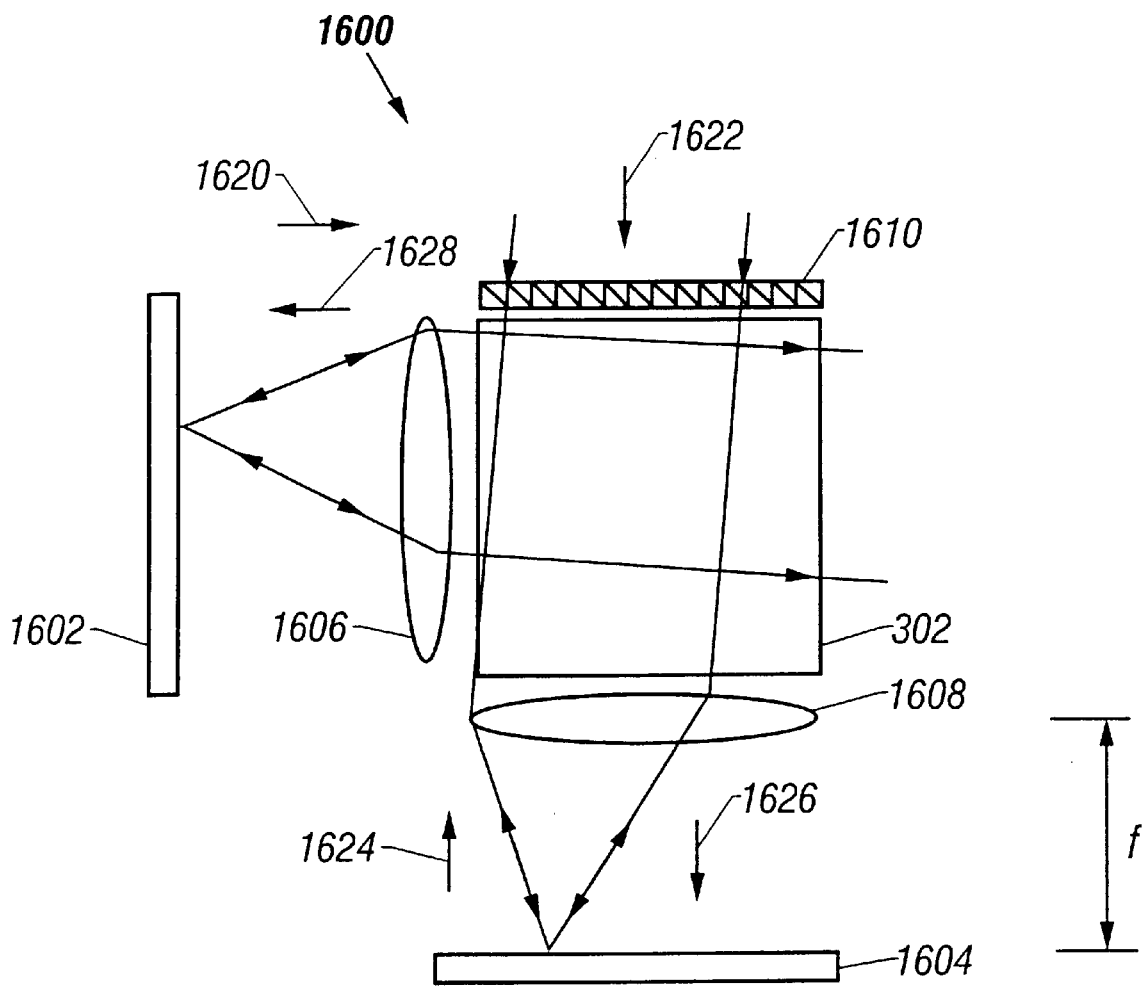
FIG. 16 shows a multifunctional associative holographic memory in accordance with the present invention.

The architecture of this system is illustrated in FIG. 16. Two DHR chips 1602 and 1604 at the two perpendicular faces of a 90-degree geometry crystal cube 302. Lens 1606 is positioned between the DHP 1602 and the crystal cube 302 to Fourier-transform the pixel array of the DHR 1602 in the crystal cube 302. Though the spacing between the lens 1606 and the center of the crystal cube 302 is required to be the focal length in some applications, such requirement is usually not necessary in many other applications. Lens 1608 is between the DHR 1604 and the crystal cube 302 and is one focal length away from the DHR 1604. This device 1600 has four modes of operation: recording, readout, refreshing, and associative recall.

Recording is performed using the reference beam 1622 and signal beam 1620. The signal beam 1620 is generated by using a beam splitter (not shown) between the DHP 1602 and the lens 1606. An external beam (not shown) is guided to the pixel array on the DHR 1602 and is spatially modulated thereby to form the signal beam 1620 by reflection. This is similar to the signal beam coupling shown in FIG. 3b. Another method to generate the signal beam 1620 is to use fixed illumination holograms shown in FIG. 7. Because of the presence of lens 1606, the image of the pixel array on the DHR chip 1602 is Fourier-transformed at the crystal cube 302, making the recorded holograms Fourier-transformed type. A beam steerer 1610 (e.g., a DOE) is used to select the angle of incidence of the reference beam 1622, so angular multiplexing can be performed to store multiple holograms in the crystal cube 302. The geometry is chosen such that for every distinct angle of incidence of the reference beam 1622, the reference beam 1622 comes to a focus on a different pixel of the DHR chip 1604 after passing through lens 1608.

To reconstruct a particular hologram, the beam steerer 1610 is used to select the appropriate angle, and the corresponding pixel of the DHR 1604 is turned on. The reference beam 1622 is focused on the proper pixel on the DHR 1604 and reflected to retrace itself back to the crystal cube 302 by passing through the lens 1608 for the second time. The retracing beam is the conjugated reference beam 1624, counter-propagating with respect to the reference beam 1622, illuminates the hologram stored in the crystal cube 302, giving rise to the phase-conjugated reconstruction 1628. The conjugated reconstruction 1628 counterpropagates with respect to the signal beam 1620 and comes to a focus on the DHR 1602 where it is detected.

Refreshing is performed by detecting a page from the reconstruction beam 1628, modulating a strong injected beam from the beam splitter described thereabove, thus generating a signal 1620 and re-recording a hologram in the crystal cube 302 with the signal beam 1620 and the reference beam 1622.

Associative recall requires two steps: first a pattern P to be associated is generated on the DHR chip 1602 and illuminates the holograms having stored images $S_j$ therein. It is well known that, in this case, the correlations $C_j$ between the pattern P and the stored images $S_j$ will form simultaneously on the back focal plane of lens 1608, where the pixel array of the DHR chip 1604 is located. According to the design restriction stated earlier, each correlation peak will form on the corresponding pixel of DHR 1604, where the intensity will be detected. Then a winner-take-all operation is performed to determine which stored pattern matches the pattern P best. This completes the first step. In the second step, the winning pixel of DHR 1604 is turned on and the beam steerer 1610 is configured appropriately to generate a proper reference beam 1622 and thereby a conjugated reference 1624. This conjugated reference beam 1624 reads out the best match among the images $S_j$ in the crystal cube 302 to pattern P to generate a corresponding conjugated reconstruction beam 1628 propagating towards the DHR chip 1602. The detected signal by DHR 1602 constitutes the result of the associative recall operation.

Additional features, e.g. thresholding, multiple associations, etc. are easily added by programming the two DHR chips 1602 and 1604 properly. Moreover, other volume multiplexing techniques can be implemented accordingly in the architecture 1600 as described herein.

The two lenses 1606 and 1608 can be made from diffractive optical elements so that they are compact. This facilitates the integration and compactness of the systems using the associative memory module of FIG. 16. This module is not lensless as in many modules in accordance with the present invention. However, the capability of associative recall is very useful in high-performance computing applications. Many variations of this architecture using, e.g. different multiplexing techniques, removing one or both of the lenses for reduced size at the expense of some features, etc. are possible, and it is understood that they constitute variants of the architecture 1600 hereabove.

Although the present invention has been described in detail with reference to a number of particular embodiments, one ordinarily skilled in the art to which this invention pertains will appreciate that various modifications and enhancements may be made without departing from the spirit and scope of the present invention. For example, photorefractive crystal $LiNbO_3$ is preferably used in the embodiments as the rewritable holographic recording medium. However, other nonlinear photorefractive crystals and other types of nonlinear optical materials can also be implemented in the compact architecture in accordance with the present invention. The geometrical shape of the recording medium is not limited to a cube and other shapes such as rectangular parallelepiped shape can be used to facilitate the system integration. The liquid crystal diffractive optical element for steering optical beams can be replaced with other compact beam steering elements. One example is a micro-mirror based on micro-mechanical electro-magnetic systems (MEMS). A MEMS micro-mirror is etched on semiconductor wafer and its orientation can be controlled by electromagnetic force. Such micro-mirrors are compact, inexpensive and easy to integrate with other components in the compact architecture such as diode lasers and the unique DHR chip. In biasing the conjugate readout with DHR chip having relatively displaced detectors and modulators, the beam steerer can be a simple diffractive optical element. In angularly multiplexed systems, for example, the desired biasing can be obtained using a simple electrically controlled optical wedge (e.g. using liquid crystals). Modulators of the OEIC chip in accordance with the present invention can operate in transmission mode instead of the reflection mode described in the preferred embodiments. Furthermore, emitters instead of modulators can be used in the compact architectures of the present invention to encode information in the holographic material.

All these and other modifications and ramifications are intended to be encompassed in the following claims, in which:

What is claimed is:

1. An optical holographic memory system, comprising:
   a surface, holding a plurality of modules to form a module array;
   at least one laser, being disposed on said surface and producing light to said modules;
   each of said modules including an optoelectronic integrated circuit and a holographic medium, said integrated circuit having a light modulator array and a photodetector array;
   said light modulator array modulating said light from said laser to record holograms indicative of information from said integrated circuit in said holographic medium; and said holographic memory system operating to use said light to reconstruct said holograms in said modules and to retrieve said information with said photodetector array.

2. A re-writable holographic memory unit, comprising:

a programmable integrated opto-electronic interface, having a detector array for receiving light signals and data readout and a modulating reflector array for encoding data on an incident light beam, said detector array and said modulating reflector array integrating with each other in said opto-electronic interface;

at least one laser, operating to generate a signal beam for writing data in said memory unit and a reference beam for reading and writing data in said memory unit;

a holographic storage medium, integrated with said opto-electronic interface, operating in combination with said signal beam and said reference beam to produce and store holograms indicative of information that is fed into said memory unit from said opto-electronic interface;

a beam coupling element, being disposed and integrated with said opto-electronic interface and said holographic storage medium, operating in combination with said laser to produce said signal beam propagating towards said opto-electronic interface, said modulating reflector array modulating said signal beam and reflecting said signal beam into said holographic storage medium; and said reference beam, interacting with said holograms in said holographic medium and generating a construction beam encoded with information in said holograms and propagating towards said detector array in said opto-electronic interface, said detector array receiving said construction beam and retrieving said information.

3. A memory unit as in claim 2, wherein said signal beam and said reference beam working in combination to produce a plurality of angularly multiplexed holograms that are spatially superimposed in said holographic storage medium.

4. A memory unit as in claim 2, wherein said signal beam and said reference beam working in combination to produce a plurality of wavelength multiplexed holograms that are spatially superimposed in said holographic storage medium.

5. A memory unit as in claim 2, wherein said signal beam and said reference beam working in combination to produce a plurality of phase-multiplexed holograms that are spatially superimposed in said holographic storage medium.

6. A memory unit as in claim 2, wherein said signal beam and said reference beam working in combination to produce a plurality of shift-multiplexed holograms that are spatially superimposed in said holographic storage medium.

7. A memory unit as in claim 2, wherein said beam coupling element is a beam splitter that is disposed and integrated between said opto-electronic interface and said holographic storage medium.

8. A memory unit as in claim 2, wherein said beam coupling element is a set of fixed holograms, interacting with said reference beam from said laser to produce said signal beam having a plurality of beam elements that propagate towards said opto-electronic interface and converge to said modulating reflector array.

* * * * *